(12) United States Patent
Hasegawa et al.

(10) Patent No.: US 12,174,266 B2
(45) Date of Patent: Dec. 24, 2024

(54) LEAKAGE CURRENT DETECTION CIRCUIT FOR SEMICONDUCTOR

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Junichi Hasegawa, Nisshin (JP); Akimasa Niwa, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

(*) Notice: Subject to any disclaimer, the term of this patent is extended or adjusted under 35 U.S.C. 154(b) by 248 days.

(21) Appl. No.: 17/732,819

(22) Filed: Apr. 29, 2022

(65) Prior Publication Data

US 2022/0357410 A1    Nov. 10, 2022

(30) Foreign Application Priority Data

May 6, 2021  (JP) .................................. 2021-078530
Jan. 19, 2022  (JP) .................................. 2022-006415

(51) Int. Cl.
*G01R 31/52* (2020.01)
*H03K 17/082* (2006.01)

(52) U.S. Cl.
CPC ......... *G01R 31/52* (2020.01); *H03K 17/0822* (2013.01); *H03K 2217/0063* (2013.01); *H03K 2217/0072* (2013.01)

(58) Field of Classification Search
CPC ................ G01R 31/52; G01R 31/3008; H03K 17/0822; H03K 2217/0063; H03K 2217/0072; H03K 17/18
(Continued)

(56) References Cited

U.S. PATENT DOCUMENTS 8,829,915 B2 * 9/2014 Nishida .................. B60L 50/51
                                                    324/509
2007/0139841 A1   6/2007 Oshima
(Continued)

FOREIGN PATENT DOCUMENTS

JP    2006-180700 A    7/2006
JP    2007-236036 A    9/2007
(Continued)

*Primary Examiner* — Tung X Nguyen
*Assistant Examiner* — Robert P Alejnikov, Jr.
(74) *Attorney, Agent, or Firm* — Posz Law Group, PLC

(57) ABSTRACT

A circuit for detecting a leakage current in a semiconductor element includes a setting circuit and a detector. The semiconductor element includes a first terminal at a high-potential-side of the semiconductor element, a second terminal at a low-potential-side of the semiconductor element, and a control terminal. The control terminal receives a signal for controlling a conduction state between the first terminal and the second terminal. The setting circuit sets a duration during which a charging current flows to the control terminal as an undetectable duration, in response to turning on the semiconductor element. The detector outputs a detected signal based on a condition that the leakage current flowing from the control terminal to the second terminal, after the undetectable duration has been elapsed.

23 Claims, 28 Drawing Sheets

(58) Field of Classification Search
USPC ........ 324/509, 503, 512, 537, 750.3, 762.01
See application file for complete search history.

(56) References Cited

U.S. PATENT DOCUMENTS

| | | |
|---|---|---|
| 2011/0068818 A1 | 3/2011 | Fukami |
| 2013/0241604 A1 | 9/2013 | Kim et al. |
| 2017/0125995 A1* | 5/2017 | Nishi .................... H02H 1/0007 |
| 2021/0006242 A1* | 1/2021 | Takagiwa ............. H03K 17/567 |

FOREIGN PATENT DOCUMENTS

| | | |
|---|---|---|
| JP | 2013-138346 A | 7/2013 |
| JP | 2014-068417 A | 4/2014 |
| JP | 2016-059205 A | 4/2016 |

* cited by examiner

LEAK DETM CYCLE

LEAKAGE CURRENT DETECTION CIRCUIT FOR SEMICONDUCTOR

CROSS REFERENCE TO RELATED APPLICATION

This application is based on Japanese Patent Application No. 2022-006415 filed on Jan. 19, 2022, which claims the benefit of Japanese Patent Application No. 2021-078530 filed on May 6, 2021, the disclosure of which are incorporated herein by reference.

TECHNICAL FIELD

The present disclosure relates to a leakage current detection circuit.

BACKGROUND

A circuit may be provided for detecting a leakage current generated between a drain and a gate or between the gate and a source in a power device such as a power MOSFET.

SUMMARY

The present disclosure describes a leakage current detection circuit for detecting a leakage current in a semiconductor element, and further describes the leakage current detection circuit including a setting circuit and a detector.

BRIEF DESCRIPTION OF THE DRAWINGS

The objects, features and advantages of the present disclosure will become more apparent from the following detailed description made with reference to the accompanying drawings. In the drawings.

DETAILED DESCRIPTION

When an n-channel MOSFET is turned on, a charging current flows into a gate. When the n-channel MOSFET is turned off, a discharging current flows out from the gate. For detecting a leakage current, it may be required to separate a duration of the flow of the charging current from a duration of the flow of the discharging current. However, the related field has not disclosed how to separate the duration of the flow of the charging current from the duration of the flow of the discharging current when detecting the leakage current.

According to a first aspect of the present disclosure, a leakage current detection circuit detects a leakage current in a semiconductor element. The leakage current detection circuit includes a setting circuit and a detector. The first semiconductor element includes a first terminal at a high-potential-side of the semiconductor element, a second terminal at a low-potential-side of the semiconductor element, and a control terminal. The control terminal receives a signal for controlling a conduction state between the first terminal and the second terminal, and is insulated from the first terminal and the second terminal. The setting circuit sets a duration during which a charging current flows to the control terminal as an undetectable duration, in response to turning on the semiconductor element. The detector outputs a detected signal based on a condition that the leakage current flows from the control terminal to the second terminal, after the undetectable duration has been elapsed.

According to the above configuration, the detector can eliminate or remove the duration of the flow of the charging current in the control terminal in order to detect the leakage current.

According to a second aspect of the present disclosure, a leakage current detection circuit detects a leakage current in a semiconductor element. The leakage current detection circuit includes a setting circuit and a detector. The first semiconductor element includes a first terminal at a high-potential-side of the semiconductor element, a second terminal at a low-potential-side of the semiconductor element, and a control terminal. The control terminal receives a signal for controlling a conduction state between the first terminal and the second terminal, and is insulated from the first terminal and the second terminal. The setting circuit sets a duration during which a discharging current flows out from the control terminal as an undetectable duration, in response to turning off the semiconductor element. The detector outputs a detected signal based on a condition that the leakage current flows from the first terminal to the control terminal, after the undetectable duration has been elapsed.

According to the above configuration, the detector can eliminate or remove the duration where the discharging current flows out from the control terminal in order to detect the leakage current.

First Embodiment

Figure 1:
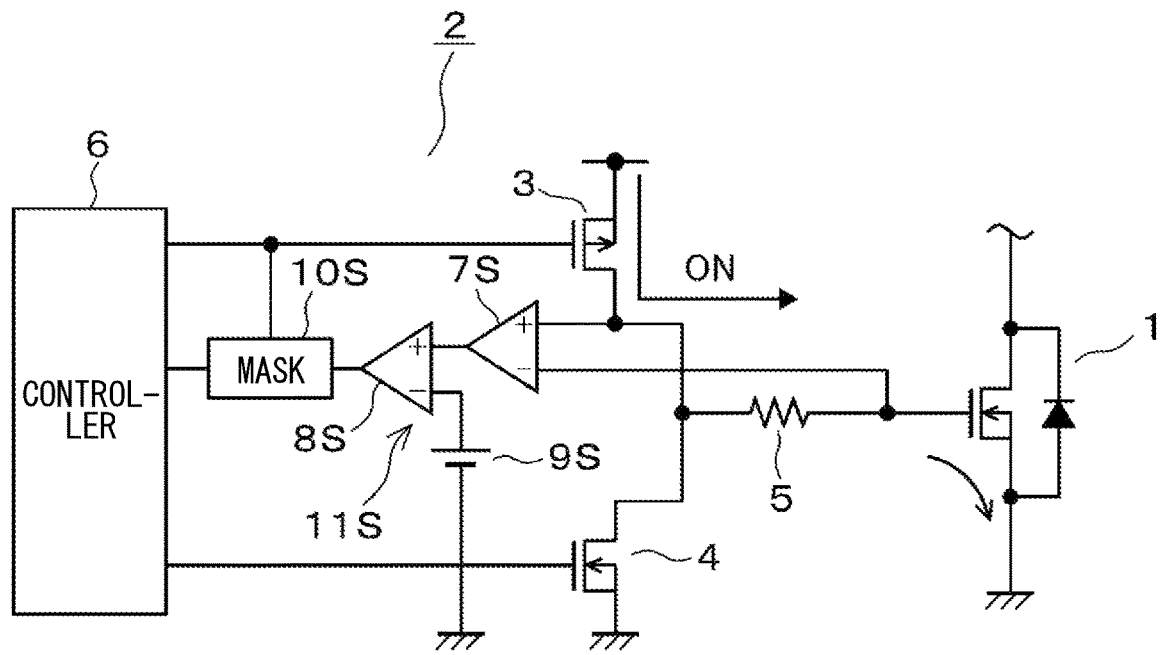
FIG. 1 illustrates a configuration of a leakage current detection circuit according to a first embodiment.

As illustrated in FIG. 1, in the present embodiment, a drive circuit 2 drives a power element 1 at a lower arm included in an inverter. The drive circuit 2 detects a leakage current generated between a gate and a source of the power element 1. The power element 1 is an example of semiconductor elements. The power element 1 may be, for example, an N-channel MOSFET. The drive circuit 2 includes a series circuit having an on-side drive element 3 and an off-side drive element 4 connected in series. The series circuit is connected between a power supply and a ground. The common connection node between the on-side drive element 3 and the off-side drive element 4 is connected to the gate of the power element 1 through a gate resistor 5. The power element 1 may also be referred to as a power device, and the gate resistor 5 may also be referred to as the gate resistance. The on-side drive element 3 and the off-side drive element 4 may respectively be, for example, a P-channel MOSFET and an N-channel MOSFET. The semiconductor element described in this specification may also be referred to as a semiconductor device.

The respective gates of the on-side drive element 3 and the off-side drive element 4 are connected to the output terminal of a controller 6, and these drive controls are executed by the controller 6. The controller 6 may also be referred to as a control module or a control block. A non-inverting input terminal of a current sense amplifier 7S is connected to the common connection node between the on-side drive element 3 and the off-side drive element 4, and an inverting input terminal of the current sense amplifier 7S is connected to the gate of the power element 1. The output terminal of the current sense amplifier 7S is connected to a non-inverting input terminal of a comparator 8S. An inverting input terminal of the comparator 8S is connected by a voltage source 9S that provides a threshold voltage. The on-side drive element 3 may also be referred to as a first drive element and the off-side drive element 4 may also be referred to as a second drive element.

An output terminal of the comparator 8S is connected to an input terminal of the controller 6 through a mask circuit 10S. The mask circuit 10S receives a gate drive signal output by the controller 6 to the on-side drive element 3. The mask circuit 10S operates to mask the output signal of the comparator 8S for only a certain period of time from the time where the controller 6 outputs the gate drive signal to the on-side drive element 3. The time period during which only a certain period of time is masked refers to a mask period, and corresponds to an undetectable period.

In the above, the gate of the power element 1 is an example of the control terminal, the drain of the power element 1 is an example of the high-potential-side terminal, and the source of the power element 1 is an example of the low-potential-side terminal. The current sense amplifier 7S and the comparator 8S correspond to low-potential-side detectors, and the mask circuit 10S corresponds to a low-potential-side setter or a low-potential-side setting circuit. The configuration elements 7S to 10S are included in a leakage current detection circuit 11S.

Figure 2:
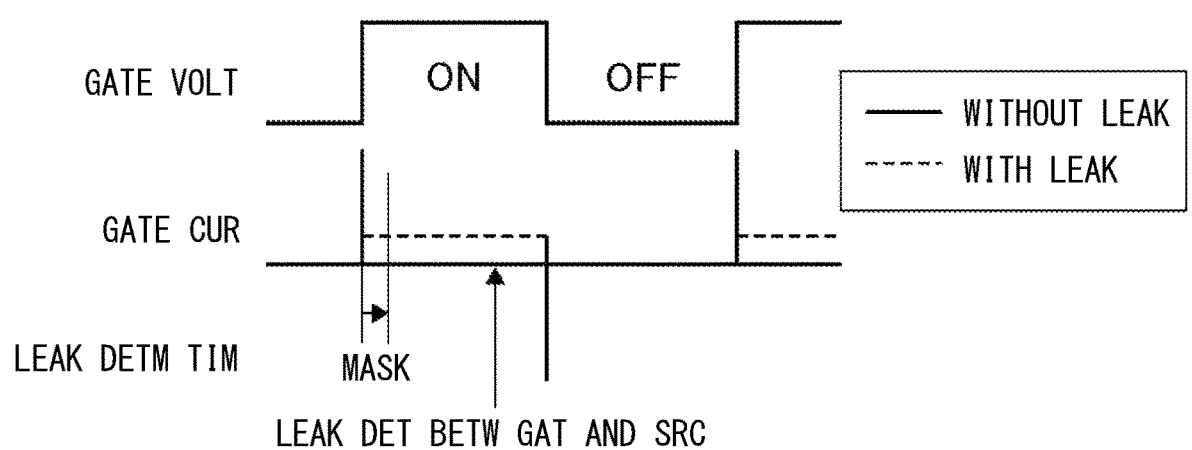
FIG. 2 illustrates respective detection timings of a gate voltage waveform, a gate current waveform, and a leakage current.

The following describes an operation in the present embodiment. When the controller 6 causes the power element 1 to be turned on, the on-side drive element 3 is turned on and the off-side drive element 4 is turned off. As illustrated in FIG. 2, a gate voltage with a high level is applied to the gate of the power element 1 through the on-side drive element 3; however, as the gate voltage rises to the high level, the current for charging the gate of the power element 1 flows momentarily. The mask circuit 10S masks the output signal of the comparator 8S from being sent to the controller 6 during this period.

When the leakage current flows between the gate and source of the power element 1, the current flows to the gate resistor 5 even after the current for charging the gate flows. Therefore, the electric potential difference across the terminal voltages of the gate resistor 5 is generated across the input terminals of the current sense amplifier 7S. As a result, the output signal of the comparator 8S is turned to the high level, and the controller 6 receives the output signal after the elapse of the mask period. Therefore, the controller 6 can detect that the leakage fault is generated between the gate and source of the power element 1.

According to the present embodiment, the mask circuit 10S sets the time period where the charging current flows into the gate as the mask period when the power element 1 is turned on. The current sense amplifier 7S and the comparator 8S outputs the detected signal in response to detecting the leakage current to the source from the gate of the power element after the mask period has been elapsed. According to the above configuration, the mask circuit 10S can eliminate or remove the time period during which the charging current flows into the gate to detect the leakage current. The mask period described in the present description may also be referred to as an undetectable duration.

Second Embodiment

Figure 3:
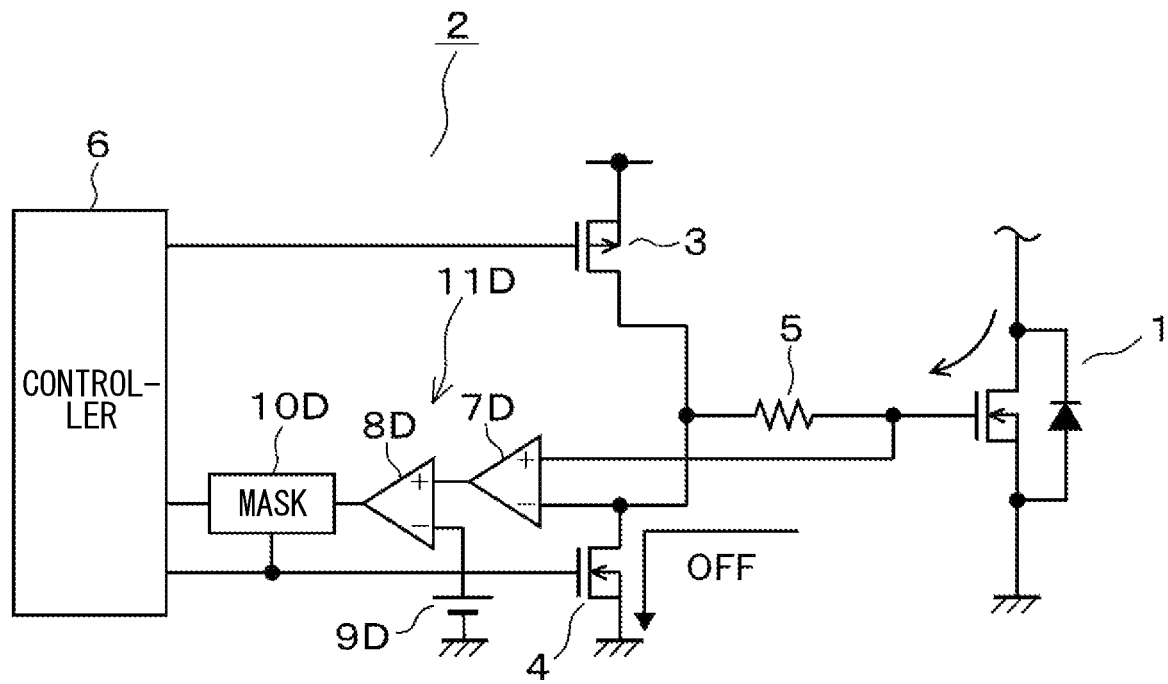
FIG. 3 illustrates a configuration of a leakage current detection circuit according to a second embodiment.

Hereinafter, the same components as those of the first embodiment are denoted by the same reference numerals, and descriptions of the same components will be omitted, and different portions will be described. As illustrated in FIG. 3, a second embodiment describes a leakage current detection circuit 11D for detecting the leakage current flowing from the drain to the gate of the power element 1, in replacement of the leakage current detection circuit 11S. The leakage current detection circuit 11D includes a current sense amplifier 7D, a comparator 8D, a power voltage source 9D, and a mask circuit 10D, which respectively correspond to the configuration elements included in the leakage current detection circuit 11S.

A non-inverting input terminal of a current sense amplifier 7D is connected to the gate of the power element 1, and an inverting input terminal of the current sense amplifier 7D is connected to the common connection node of between the on-side drive element 3 and the off-side drive element 4. The mask circuit 10D receives a gate drive signal output by the controller 6 to the off-side drive element 4. The mask circuit 10D is configured as illustrated in, for example, FIGS. 5 and 6.

Figure 5:
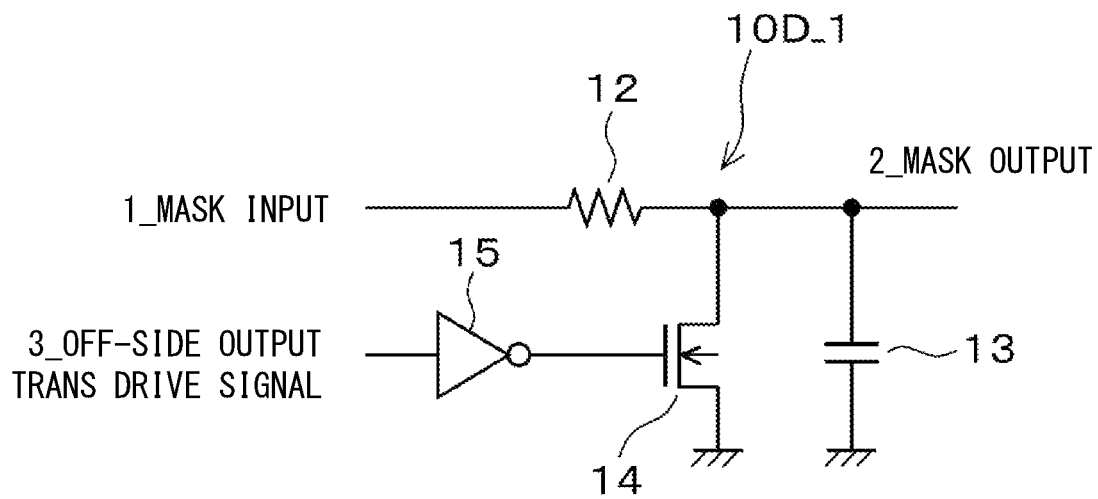
FIG. 5 illustrates a first example of a mask circuit.

In the mask circuit 10D_1 illustrated in FIG. 5, the N-channel MOSFET 14 is connected to a capacitor 13 in parallel in an RC filter having a resistor 12 and the capacitor 13, and the gate drive signal of the off-side drive element 4 is transmitted to the gate of the N-channel MOSFET 14 through a NOT gate 15. In the time period during which the off-side drive element 4 is turned off, the N-channel MOSFET 14 is turned on so that the capacitor 13 is short-circuited. In the time period during which the off-side drive element 4 is turned on, the N-channel MOSFET 14 is turned off to delay the output of the output signal to perform masking through the function of the RC filter.

Figure 6:
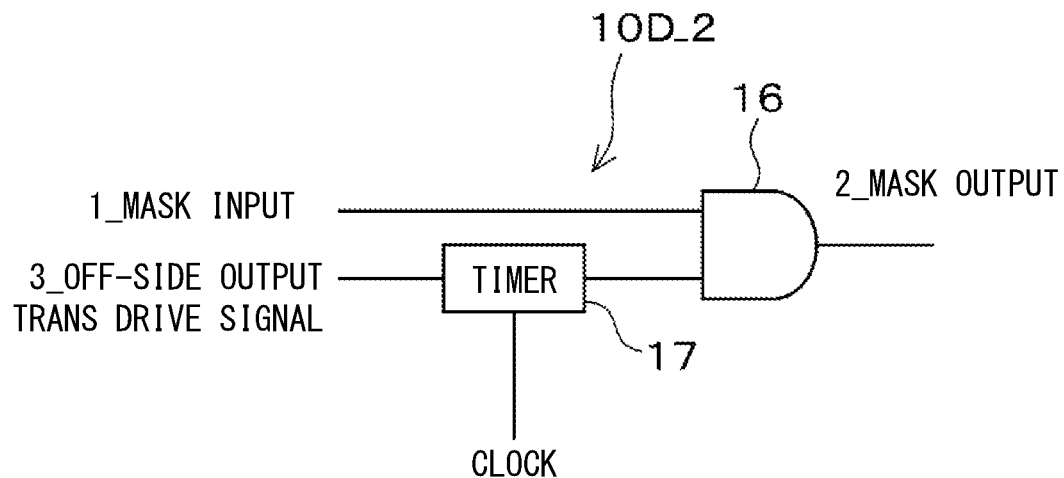
FIG. 6 illustrates a second example of the mask circuit.

The mask circuit 10D_2 illustrated in FIG. 6 is a combination of an AND gate 16 and a timer 17. One of the input terminals of the AND gate 16 receives the output signal of the comparator 8D, and the other one of the input terminals receives the gate drive signal of the off-side drive element 4 through the timer 17. The timer 17 starts counting the clock when the gate drive signal reaches the high level, and sets the input terminal of the AND gate 16 to the high level to cause the comparator 8D output the output signal after the elapse of the mask period which is set. The mask circuit 10S can also be configured by the identical principle as the mask circuits 10D_1 and 10D_2. The current sense amplifier 7D and the comparator 8D correspond to high-potential-side detectors, and the mask circuit 10 corresponds to a high-potential-side setter or a high-potential-side setting circuit. The configuration elements 7S to 10S are included in a leakage current detection circuit 11S.

Figure 4:
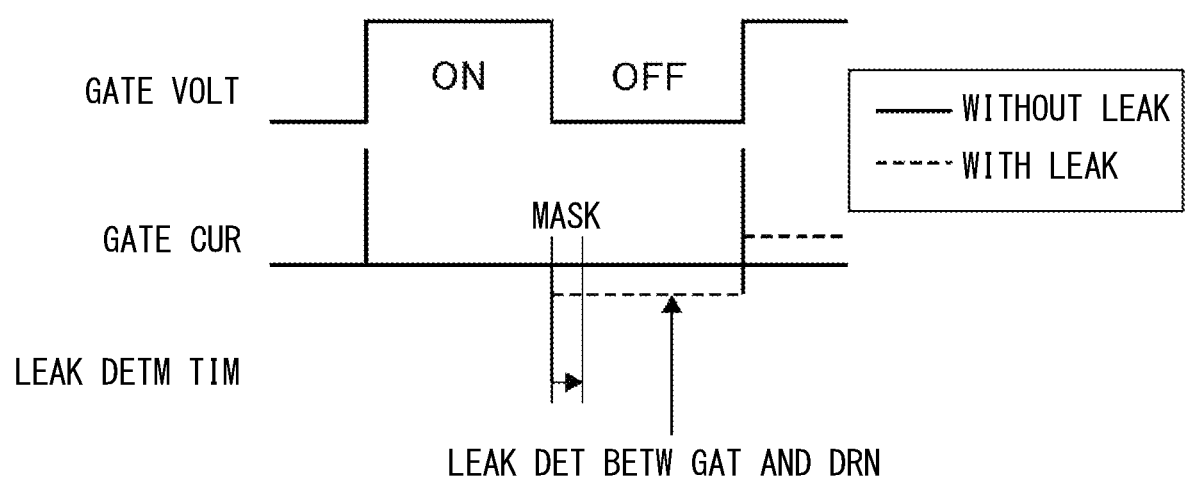
FIG. 4 illustrates respective detection timings of a gate voltage waveform, a gate current waveform, and a leakage current.

The following describes an operation in the second embodiment. When the controller 6 causes the power element 1 to be turned off, the on-side drive element 3 is turned off and the off-side drive element 4 is turned on. As illustrated in FIG. 4, a gate voltage with a low level is applied to the gate of the power element 1 through the off-side drive element 4; however, as the gate voltage drops to the low level, the discharging current flows momentarily from the gate of the power element 1. The mask circuit 10D masks the output signal of the comparator 8D to prevent the output signal from being sent to the controller 6 during this period.

When the leakage current flows between the gate and drain of the power element 1, the current flows to the gate resistor 5 even after the discharging current flows from the gate. Therefore, the electric potential difference across the terminal voltages of the gate resistor 5 is generated across the input terminals of the current sense amplifier 7D. As a result, the output signal of the comparator 8D is turned to the high level, and the controller 6 receives the output signal after the elapse of the mask period. Therefore, the controller 6 can detect that the leakage fault is generated between the gate and drain of the power element 1.

According to the second embodiment, the mask circuit 10D sets the time period where the discharging current flows out from the gate as the mask period when the power element 1 is turned off. The current sense amplifier 7D and the comparator 8D output the detected signal in response to detecting the leakage current to the source from the gate of the power element after the mask period has been elapsed. According to the above configuration, the mask circuit 10D can eliminate or remove the time period during which the charging current flows into the gate to detect the leakage current.

Third Embodiment

Figure 7:
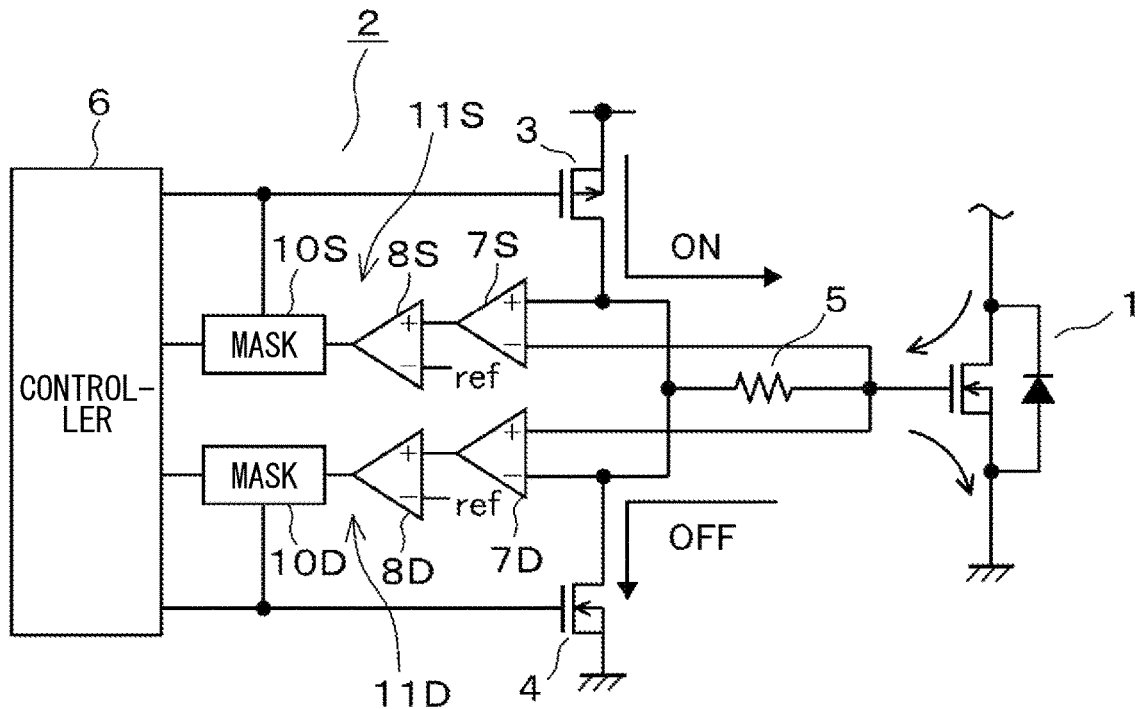
FIG. 7 illustrates a configuration of a leakage current detection circuit according to a third embodiment.
Figure 8:
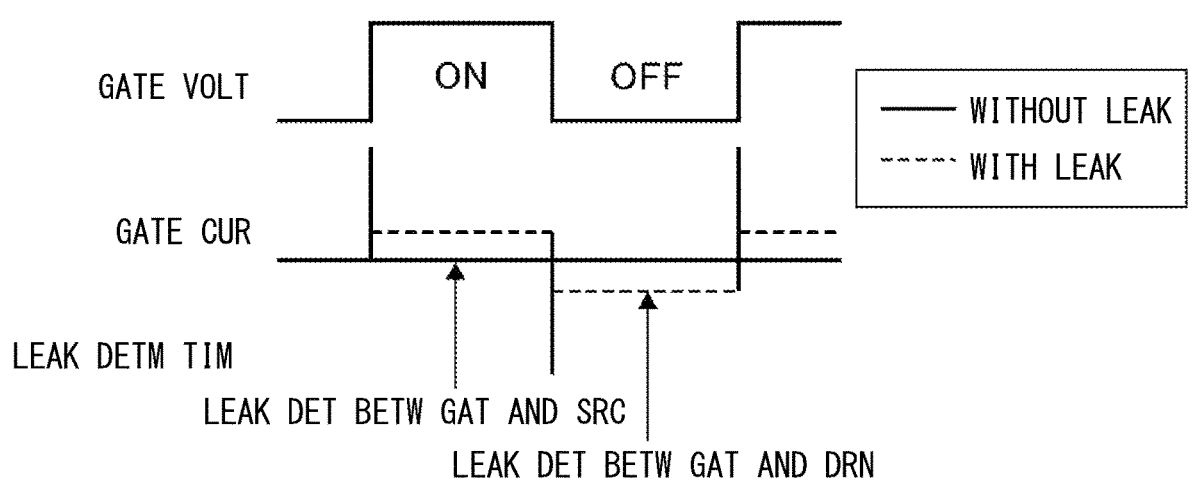
FIG. 8 illustrates respective detection timings of a gate voltage waveform, a gate current waveform, and a leakage current.

As illustrated in FIGS. 7 and 8, the third embodiment includes both of the leakage current detection circuit 11S described in the first embodiment and the leakage current detection circuit 11D described in the second embodiment.

Fourth Embodiment

Figure 9:
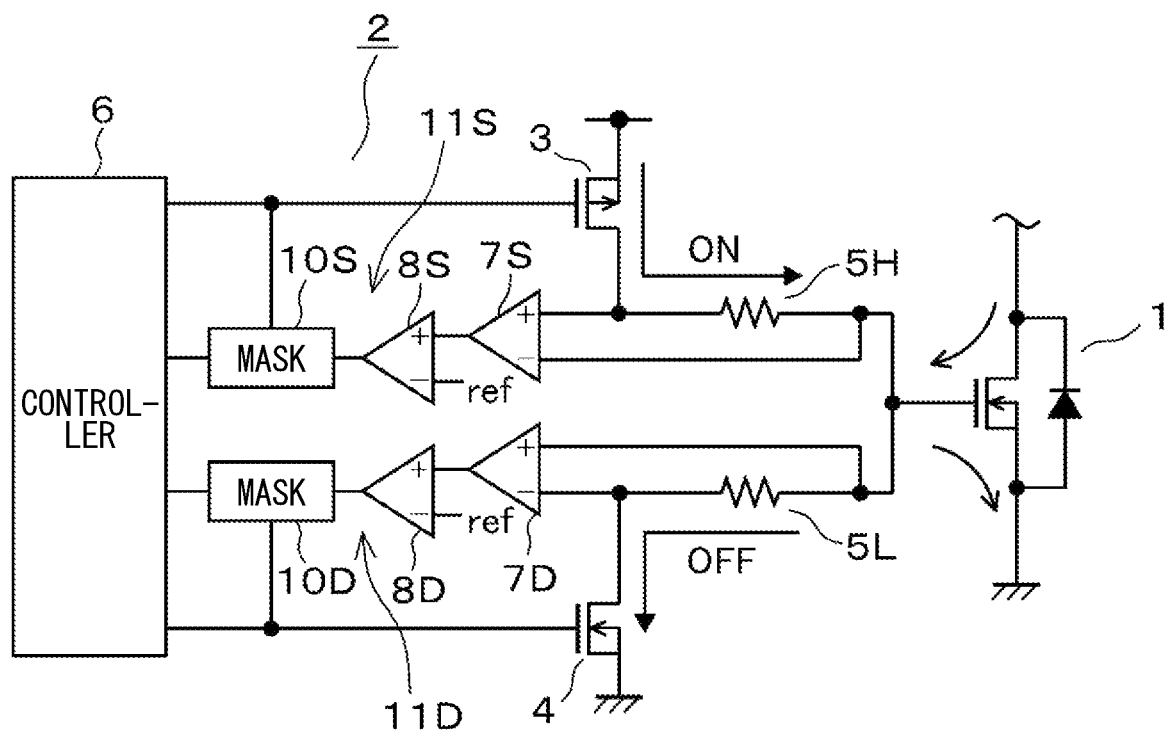
FIG. 9 illustrates a configuration of a leakage current detection circuit according to a fourth embodiment.

As illustrated in FIG. 9, in contrast to the gate resistor 5 in the configuration described in the third embodiment, a fourth embodiment describes a gate resistor 5H and a gate resistor 5L are connected. The gate resistor 5H is connected between the source of the on-side drive element 3 and the gate of the power element 1, and the gate resistor 5L is connected between the drain of the off-side drive element 4 and the gate of the power element 1. The gate resistor 5H is connected between the first input terminal and the second input terminal of the current sense amplifier 7S, and the gate resistor 5L is connected between the first input terminal and the second input terminal of the current sense amplifier 7D.

According to the fourth embodiment, the time for turning on the power element 1 and the time for turning off the power element 1 are individually adjusted. Therefore, it is possible to detect that the leakage fault occurs between the drain and source of the power element 1 or between the drain and gate of the power element 1 even though the respective resistance value of the gate resistors 5H and 5L are set to be different values.

Fifth Embodiment

Figure 10:
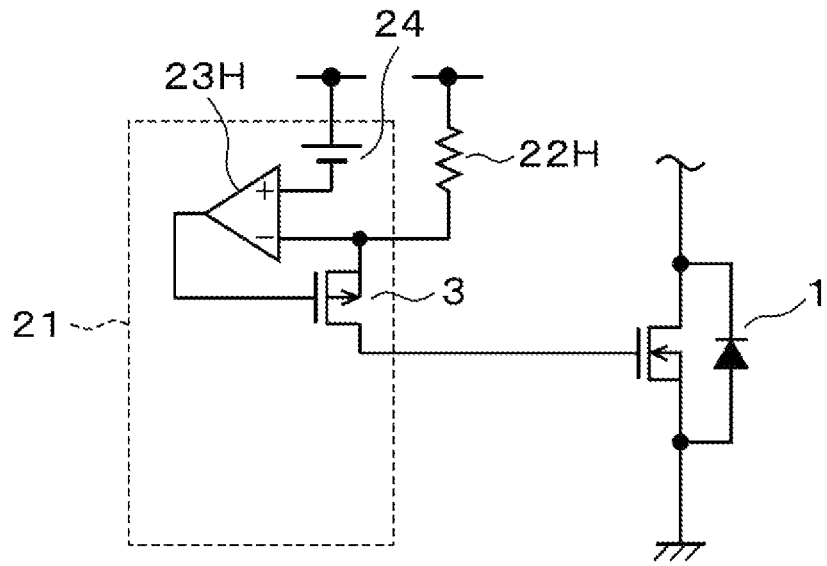
FIG. 10 illustrates a drive circuit of a constant current drive system in a fifth embodiment.

As illustrated in FIG. 10, a drive circuit 21 as a constant current drive system is adopted in a fifth embodiment, in replacement of the drive circuit 2. FIG. 10 illustrates only the on-drive element 3 side. A shunt resistor 22H is connected between the power supply and the drain of the on-side drive element 3. A non-inverting input terminal of a drive amplifier 23H is connected to a negative terminal of a voltage source 24 whose positive terminal is connected to the power supply. An inverting input terminal of the drive amplifier 23H is connected to the source of the on-side drive element 3. The output terminal of the drive amplifier 23H is connected to the gate of the on-side drive element 3. The enable control of the drive amplifier 23H is executed by a control logic (not shown). The drive amplifier 23H controls a gate electric potential of the on-side drive element 3 such that the terminal voltage of the shunt resistor 22H is equal to a voltage provided to the non-inverting input terminal.

Figure 11:
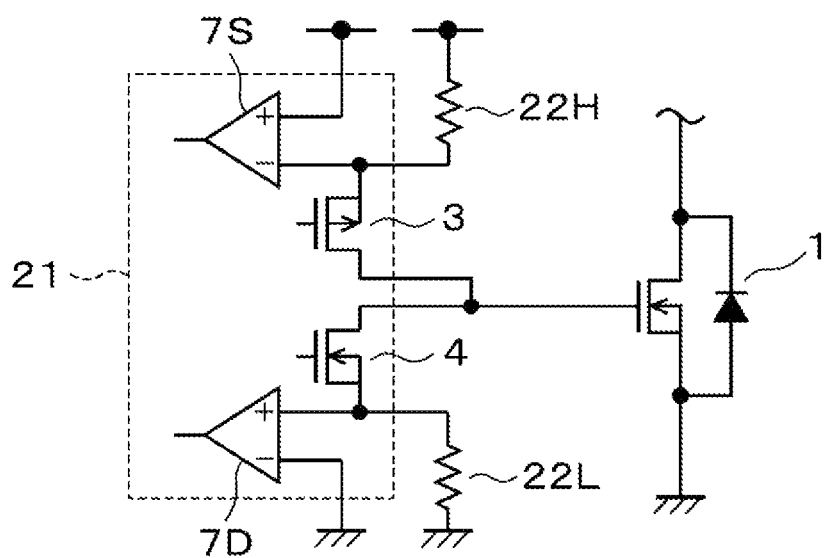
FIG. 11 illustrates a configuration of a leakage current detection circuit.

Although FIG. 11 illustrates the leak current detection circuit including the off-side drive element 4 side, FIG. 11 omits the illustration of the drive amplifier 23. A shunt resistor 22L is connected between the source of the off-side drive element 4 and the ground. The non-inverting input terminal of the current sense amplifier 7S is connected to the power supply, and the inverting input terminal of the current sense amplifier 7S is connected to the source of the on-side drive element 3. The non-inverting input terminal of the current sense amplifier 7D is connected to the source of the off-side drive element 4, and the inverting input terminal of the current sense amplifier 7D is connected to the ground.

According to the fifth embodiment, even in the configuration without the gate resistor at the time of driving the power element 1, it is possible to detect the occurrence of the leakage fault between the gate and source of the power element 1 or between the drain and gate of the power element 1.

Sixth Embodiment

Figure 12:
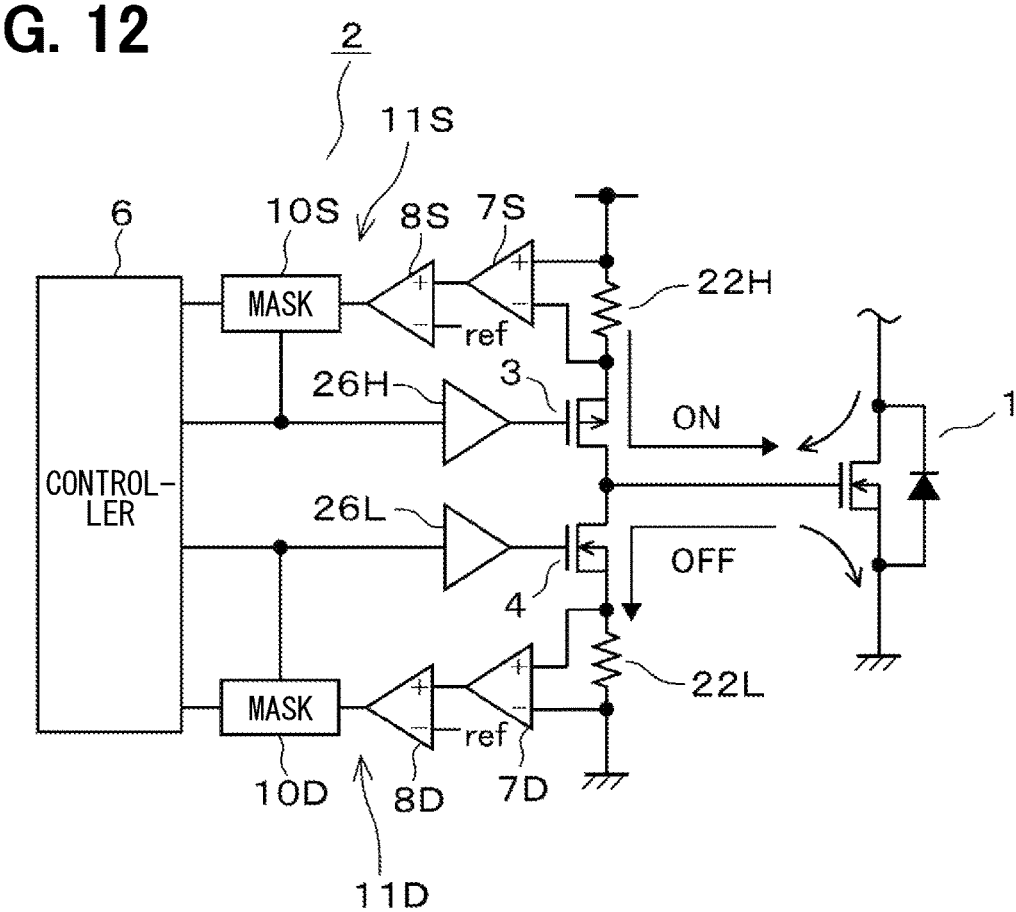
FIG. 12 illustrates a configuration of a leakage current detection circuit according to a sixth embodiment.

As illustrated in FIG. 12, a sixth embodiment adopts the gate resistor 5 in replacement of the shunt resistors 22H, 22L described in the fifth embodiment to detect the leakage current in the drive circuit 2 in the voltage drive system such as the first embodiment. In other words, the input terminal of the current sense amplifier 7S is connected to both ends of the shunt resistor 22H, the input terminal of the current sense amplifier 7D is connected to both ends of the shunt resistor 22L. The controller 6 controls the respective gate potentials of the on-side drive element 3 and the off-side drive element 4 through the drive amplifiers 26H, 26L.

Seventh Embodiment

Figure 13:
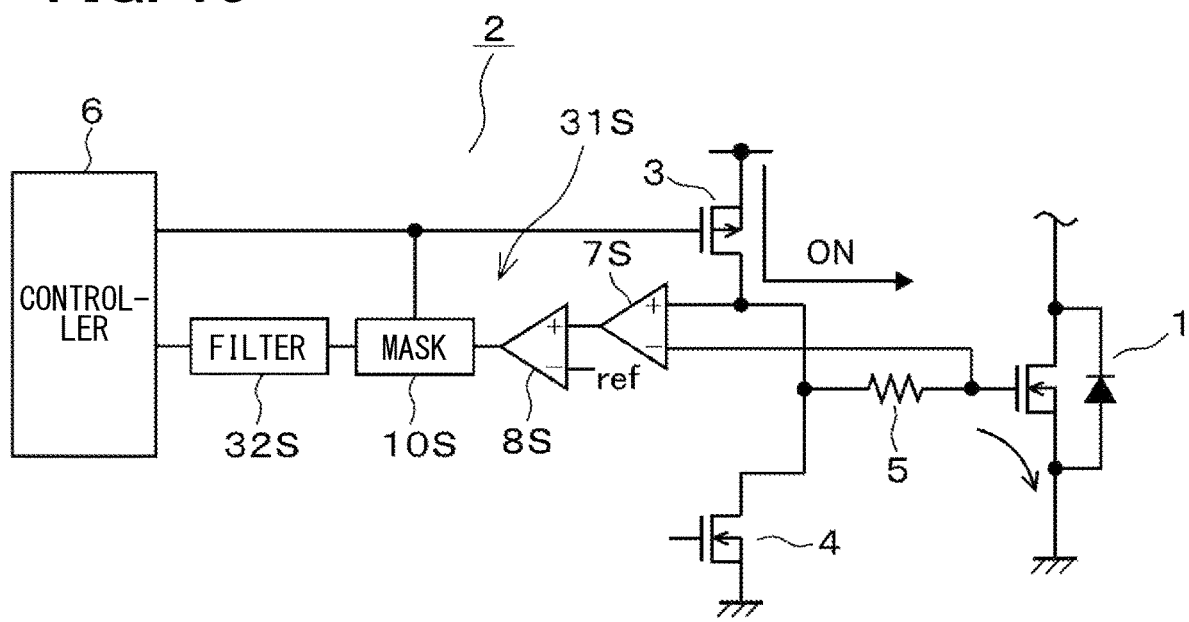
FIG. 13 illustrates a configuration of a leakage current detection circuit according to a seventh embodiment.
Figure 14:
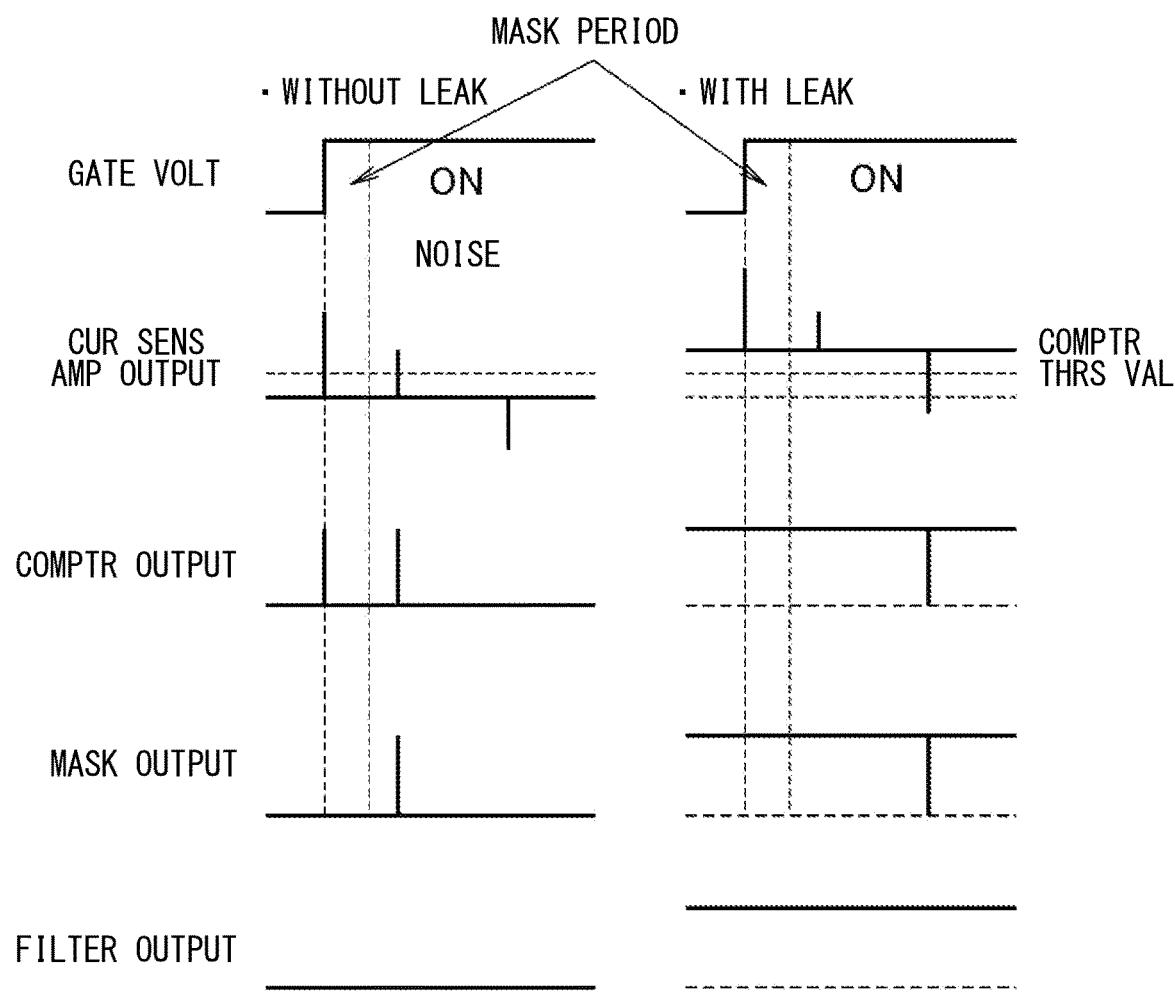
FIG. 14 illustrates a gate voltage waveform and an output signal of each circuit.

A leakage current detection circuit 31S described in a seventh embodiment as illustrated in FIG. 13 includes a low-pass filter 32S disposed between the mask circuit 10 and the controller 6 in the leakage current detection circuit 11S in the first embodiment. The gate wiring of the power element 1 is a terminal on which noise is very likely to be placed, and the leakage current is a signal whose level is smaller than the current flow during turn-on and turn-off. If the threshold voltage of the comparator 8 is set so as to detect such a minute level signal, noise may be detected. In the seventh embodiment, the low-pass filter 32S is disposed to remove the noise generated irregularly as illustrated in FIG. 14.

Eighth Embodiment

Figure 15:
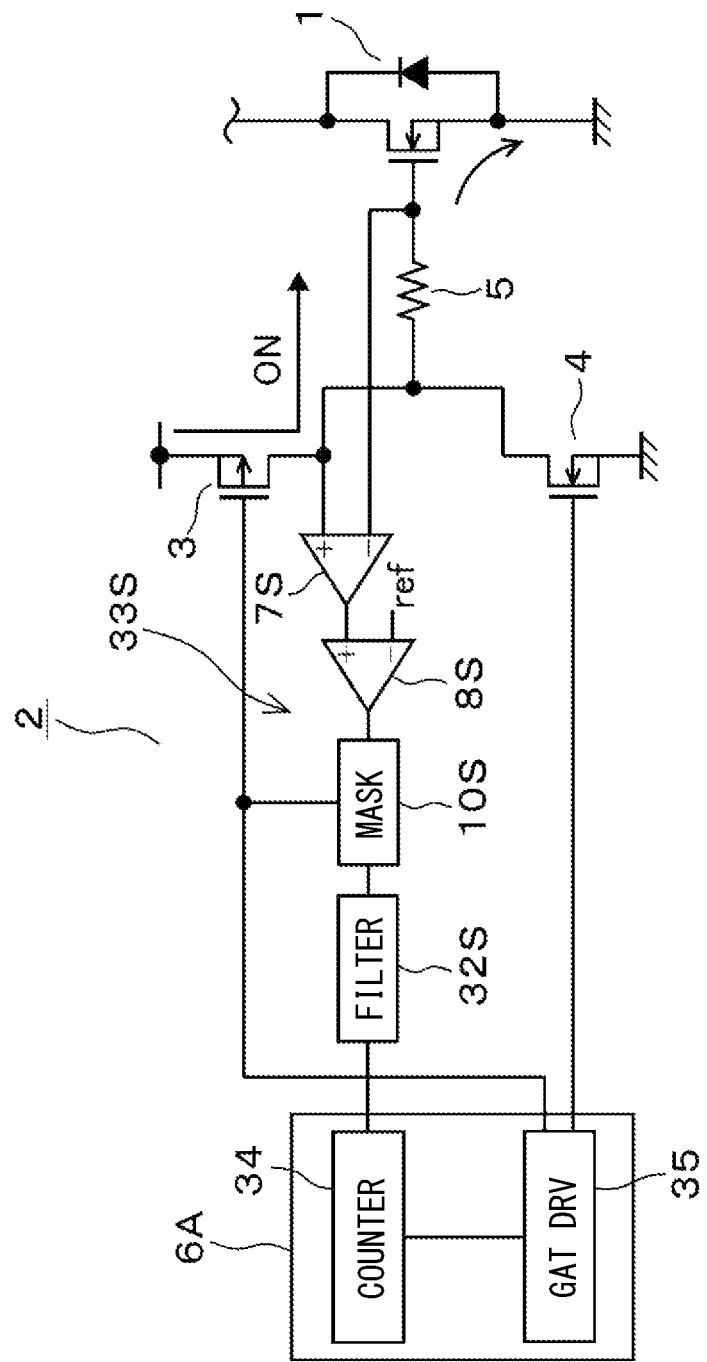
FIG. 15 illustrates a configuration of a leakage current detection circuit according to an eighth embodiment.

A leakage current detection circuit 33S described in an eighth embodiment as illustrated in FIG. 15 includes a counter 34 inside a controller 6A. The leakage current detection circuit 33S causes the comparator 8S to continuously output the output signal through the mask circuit 10S and the filter 32S to count the number of changes to the high level. The counter 34 receives a binary level signal output by a gate driver 35 to the gate of the on-side drive element 3, in other words, the gate voltage. The low-potential-side detector includes the counter 34.

Figure 16:
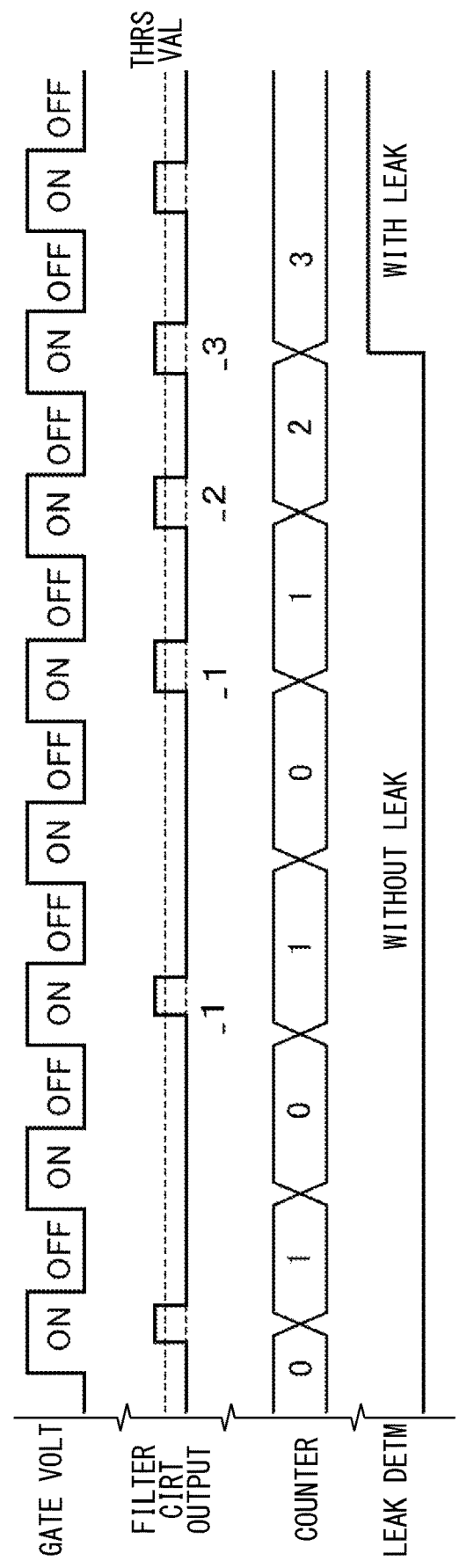
FIG. 16 illustrates a timing chart showing a change in a count value of a counter.

For example, as illustrated in FIG. 16, in a situation where the gate voltage is changed to alternately turn on and off the on-side drive element 3 through the gate driver 35, based on the condition that the output signal of the filter 32S exceeds a threshold value over three consecutive on/off cycles, the counter 34 outputs the detected signal of the leakage current at the timer where the count value of the counter 34 reaches "3". If the output signal of the comparator 8S does not continuously change to the high level, the counter 34 is reset.

Ninth Embodiment

Figure 17:
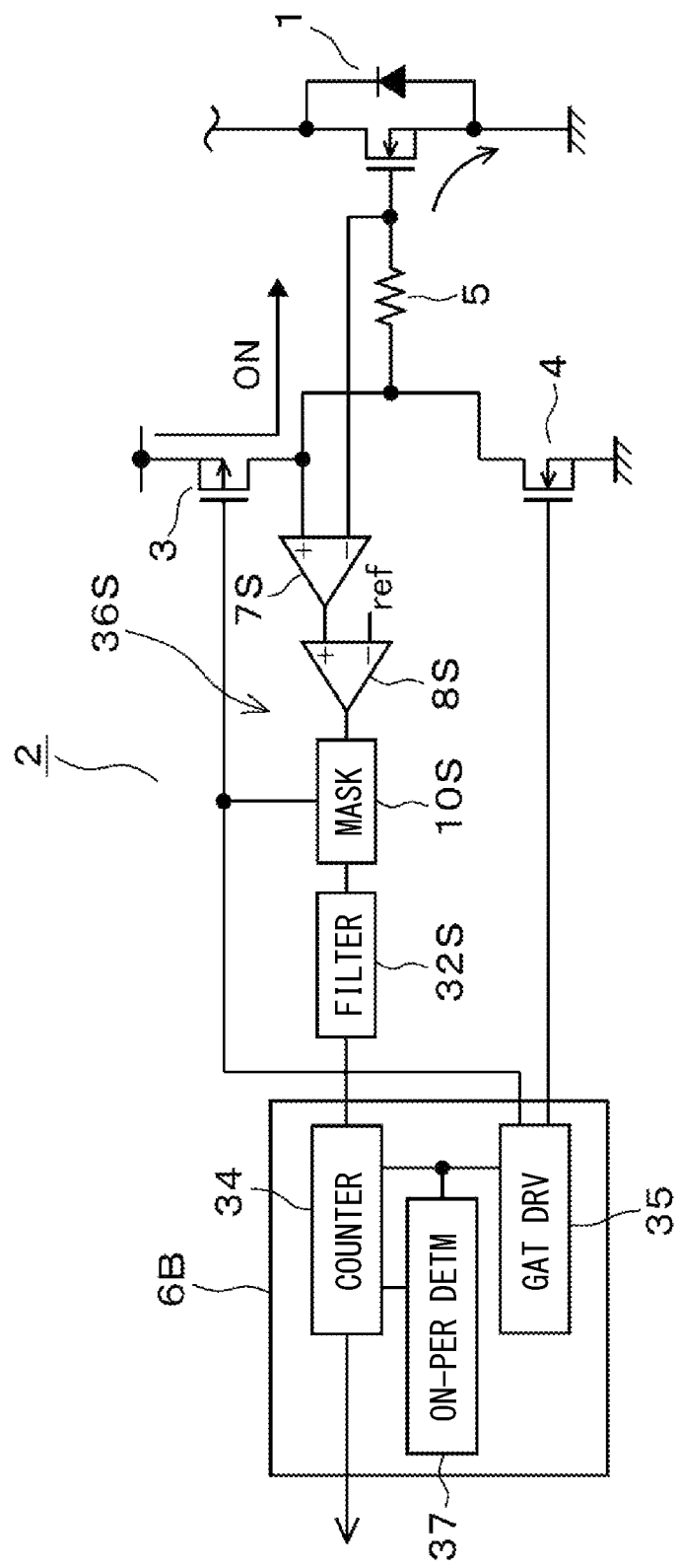
FIG. 17 illustrates a configuration of a leakage current detection circuit according to a ninth embodiment.
Figure 18:
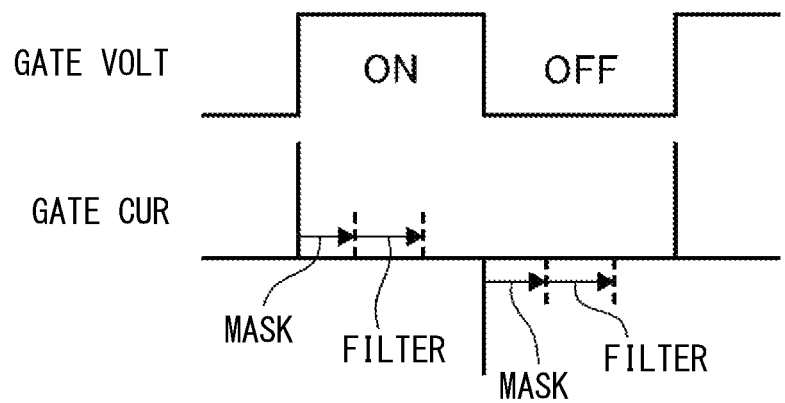
FIG. 18 illustrates a time length of on-time of a gate voltage where the leakage current is detectable.

A leakage current detection circuit 36S is described in a ninth embodiment as illustrated in FIG. 17. The leakage current detection circuit 36S includes a controller 6B further having the on-period determination device 37. As illustrated in FIG. 18, when an on-pulse width of the gate voltage is longer than the sum of the mask period set by the mask circuit 10S and the time-constant time of the filter 32S, the leakage current is detectable.

Figure 19:
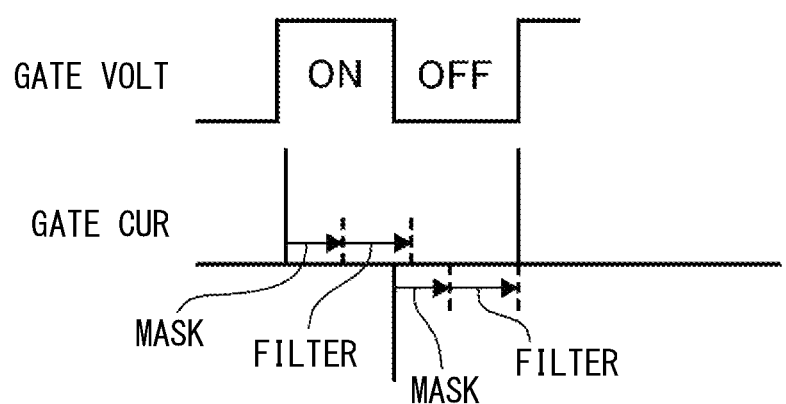
FIG. 19 illustrates a time length of on-time of a gate voltage where the leakage current cannot be detected.
Figure 20:
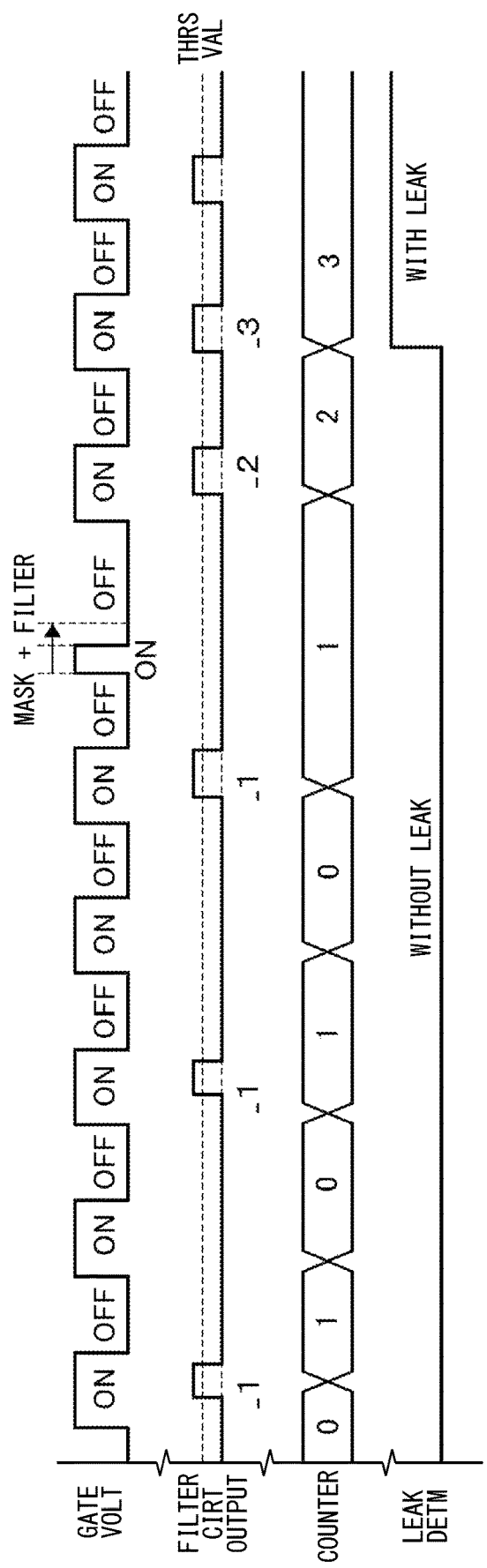
FIG. 20 illustrates a timing chart showing a change in a count value of a counter.

As illustrated in FIG. 19, the leakage current is undetectable when the width of the on-pulse is shorter than the sum of the mask time period and the time-constant time. In the ninth embodiment, the on-period determination device 37 compares the length of the on-pulse width with the sum of the mask period and the time-constant time as the threshold value, and inhibits the reset of the counter 34 based on the condition that the pulse width is shorter than the threshold value. As a result, regardless of the situation where the leakage current is actually flowing, it is possible to prevent the situation where the leakage current cannot be detected or the detection of the leakage current is delayed due to the reset of the counter 34 for a shorter on-period of the on-side drive element 3.

Tenth Embodiment

Figure 21:
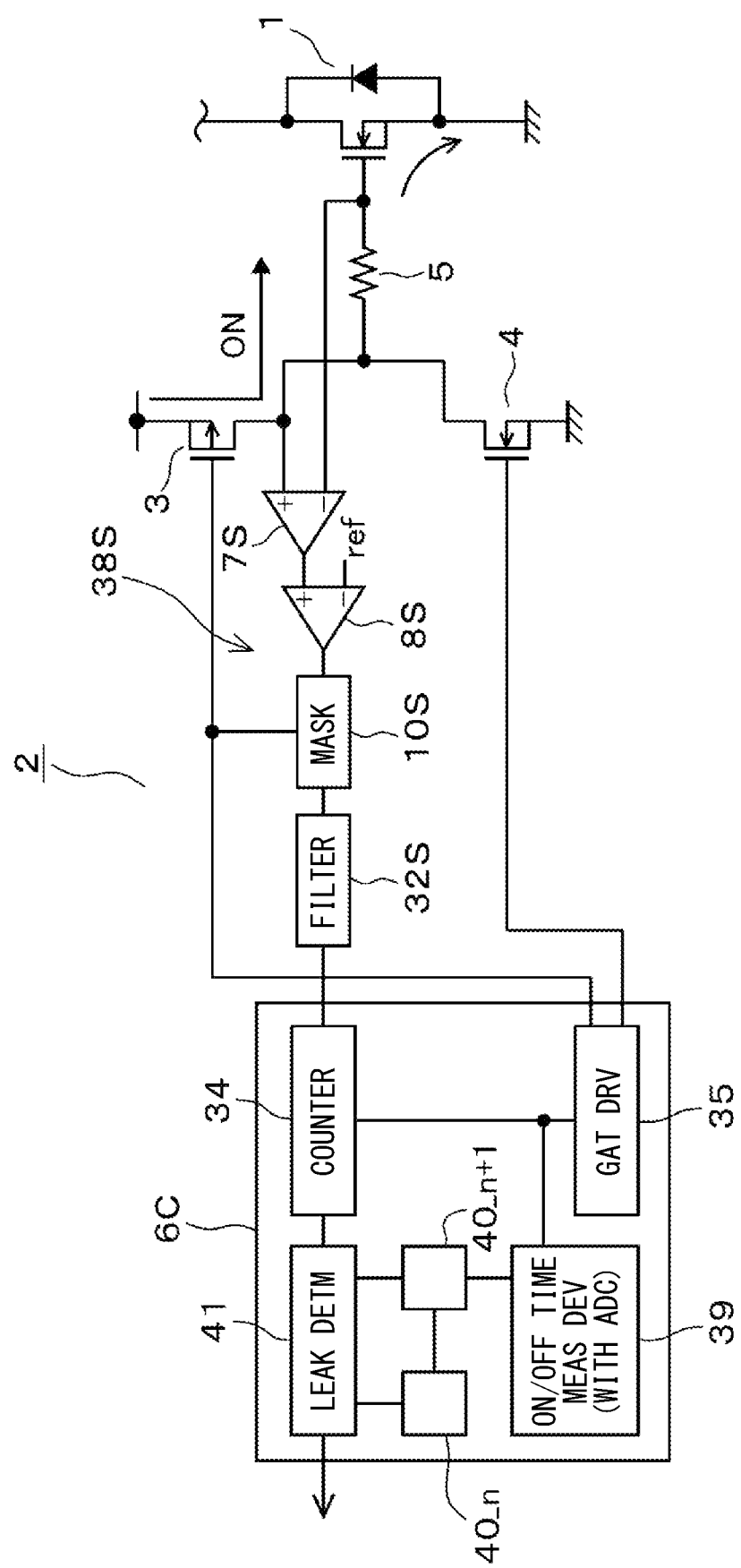
FIG. 21 illustrates a configuration of a leakage current detection circuit according to a tenth embodiment.

A tenth embodiment describes a leakage current detection circuit 38S as illustrated in FIG. 21. The leakage current detection circuit 38S includes a controller 6C in replacement of the controller 6A in the leakage current detection circuit 33S in the eighth embodiment. The controller 6C includes the essential configuration elements of the controller 6A, and further includes an on-time measurement device 39, on-time registers 40_$n$ and 40_$n$+1, and a leakage determination device 41. The on-time measurement device 39, the on-time registers 40_$n$ and 40_$n$+1, and the leakage determination device 41 are included in the low-potential-side detector.

Figure 22:
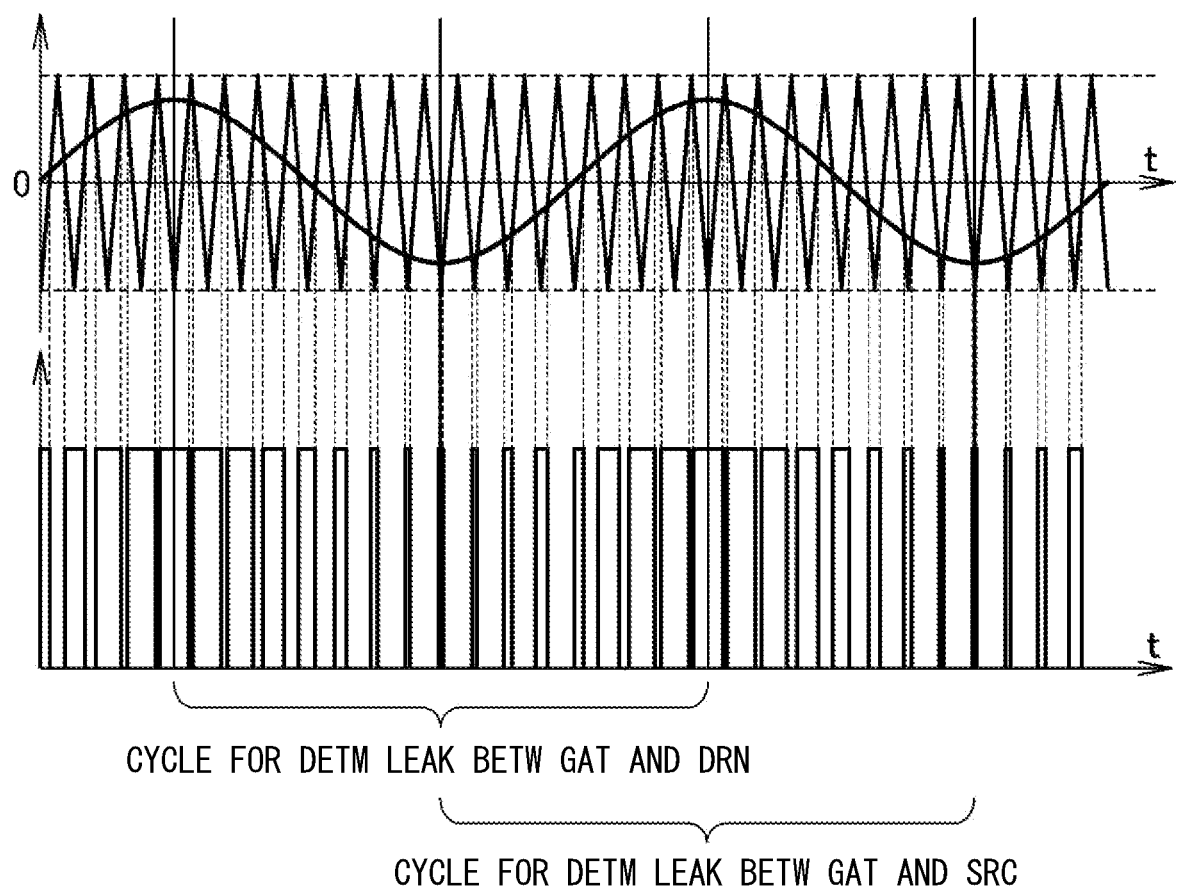
FIG. 22 illustrates a cycle for determining the leakage current.
Figure 23:
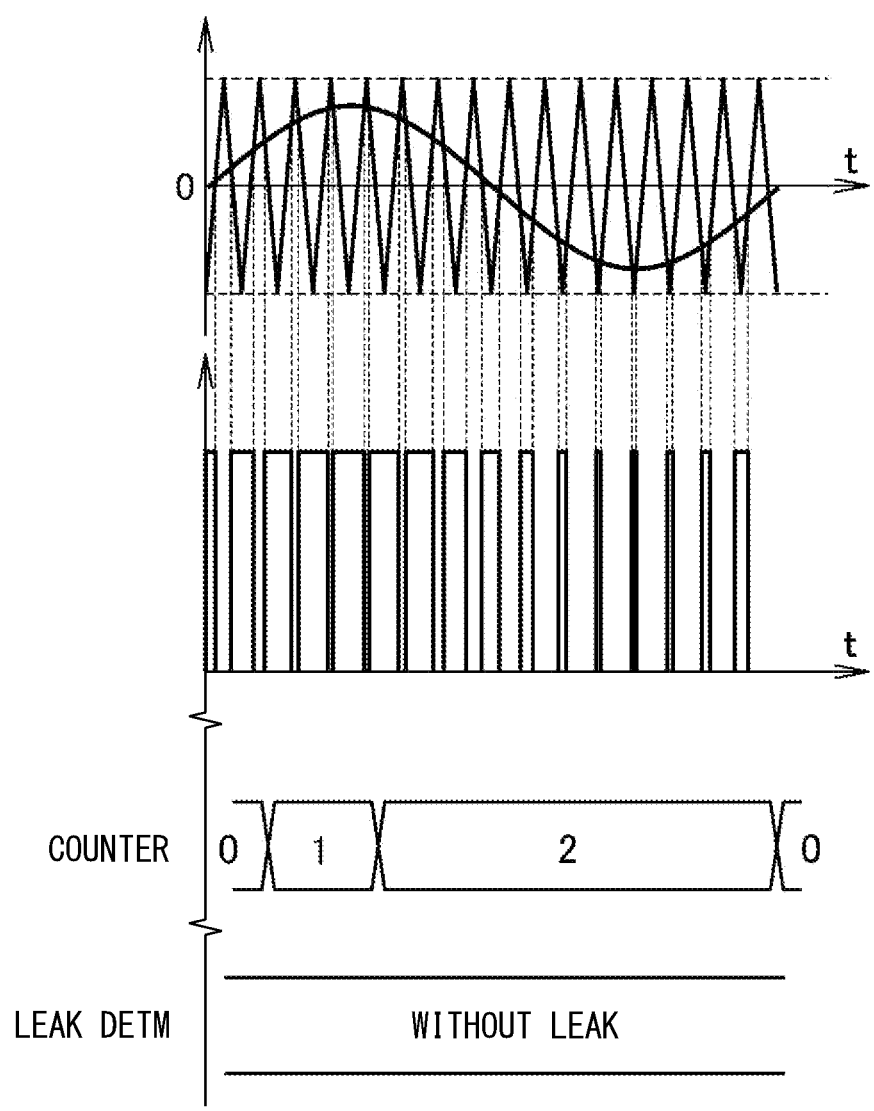
FIG. 23 illustrates a situation without the leakage current.

As illustrated in FIG. 22, in the tenth embodiment, it is assumed that the pattern of the on/off control of the power element 1 is repeated for each electric angle period according to a predetermined waveform such as a sine wave. The on-time measurement device 39 measures the on-time width of the gate drive signal output by the gate driver 35, and sequentially stores the on-time width into the on-time register 40_$n$+1. The previous measurement result is stored in the on-time register 40_$n$. The leakage determination device 41 compares the register value of the on-time register 40_$n$ with the register value of the on-time register 40_$n$+1. When the register value of the on-time register 40_$n$ decreases to be lower than the register value of the on-time register 40_$n$+1, the leakage determination device 41 confirms the on-time register 40_$n$ at this time as the minimum value. The period from the minimum value to the determination of the next minimum value is one cycle of the electric angle, which is the leakage determination cycle between the gate and the source as illustrated in FIG. 22.

Figure 24:
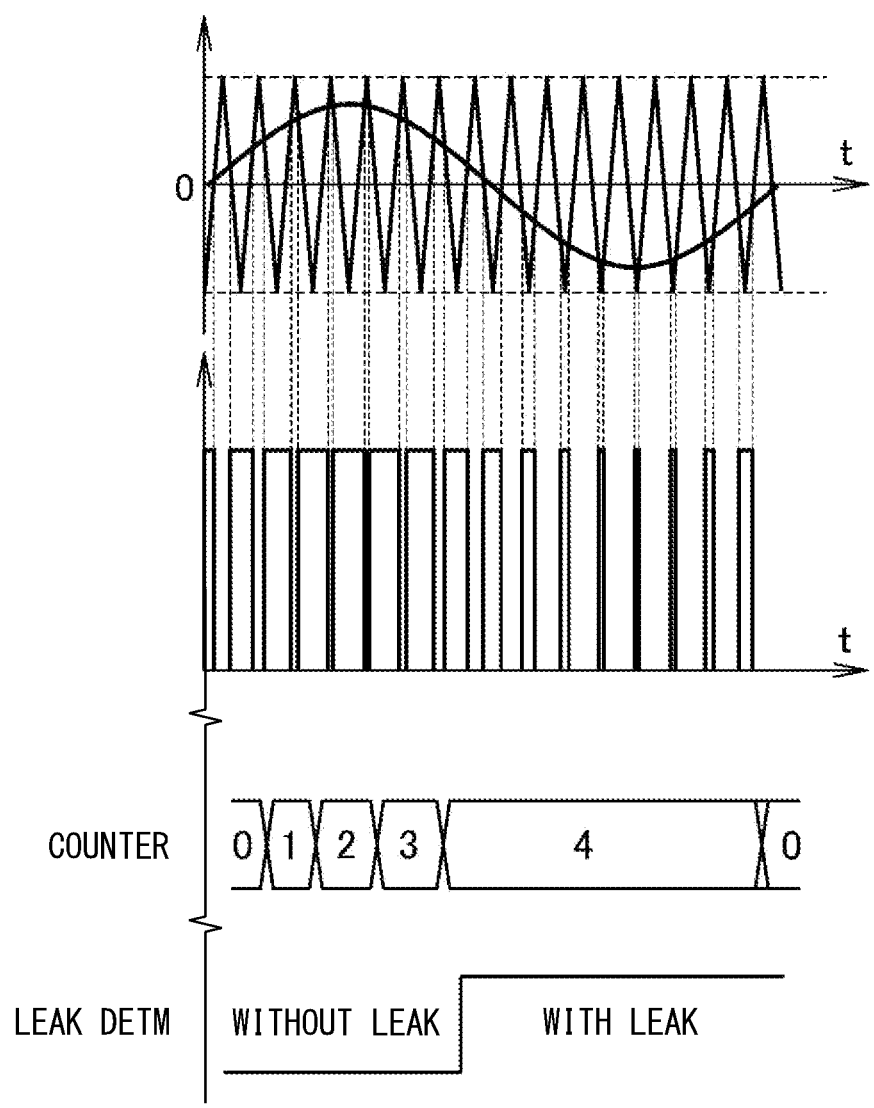
FIG. 24 illustrates a situation with the leakage current.

The leakage determination device 41 determines that there is a leakage between the gate and the source, based on a condition that the count value of the counter 34 is larger than or equal to "4" as shown in, for example, FIG. 24 in the above determination cycle. With regard to the cycle for determining the leakage between the gate and source as illustrated in FIG. 22, as similar to the above description, the register value of the on-time register 40_$n$ and the register value of the on-time register 40_$n$+1 are compared to confirm the maximum value, and the determination cycle may be set until the next maximum value is confirmed.

Eleventh Embodiment

Figure 25:
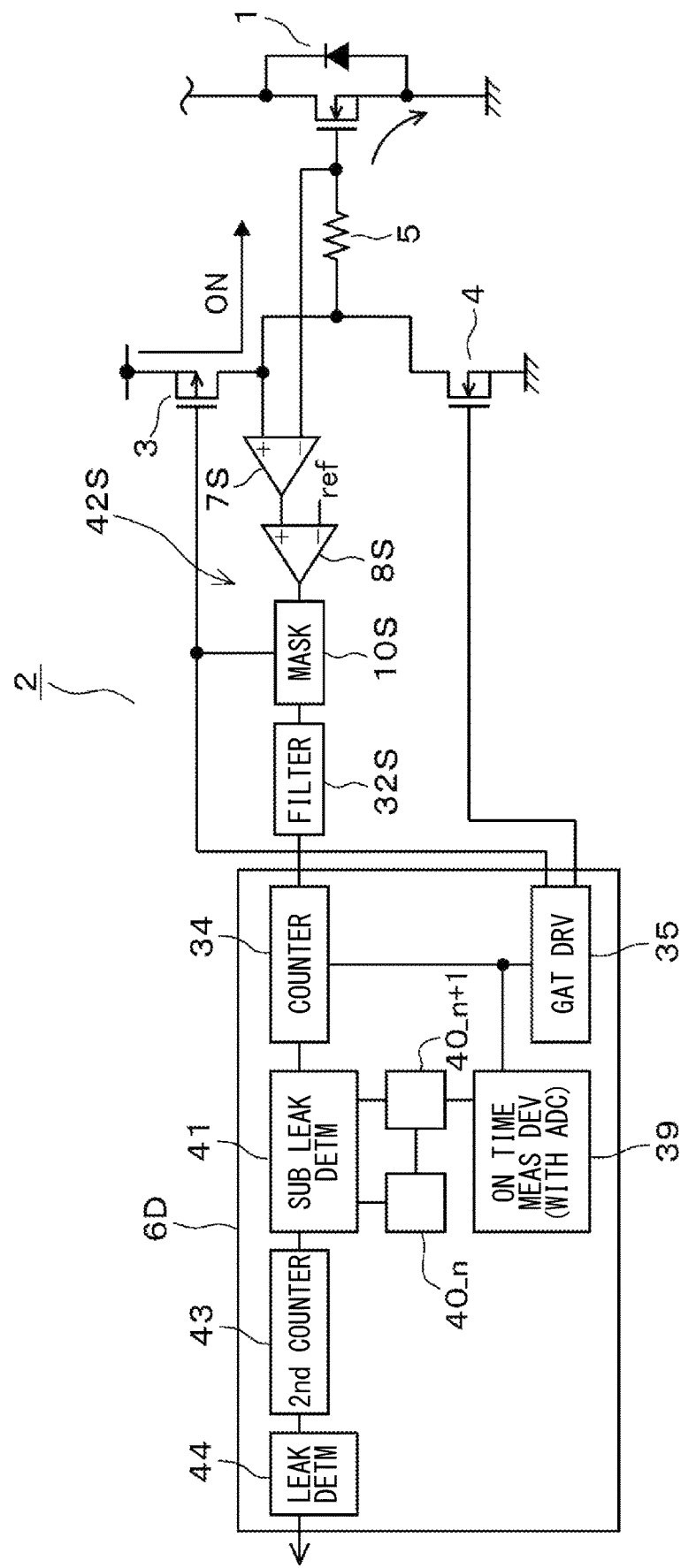
FIG. 25 illustrates a configuration of a leakage current detection circuit according to an eleventh embodiment.

An eleventh embodiment describes a leakage current detection circuit 42S as illustrated in FIG. 25. The leakage current detection circuit 42S includes a controller 6D in replacement of the controller 6C in the leakage current detection circuit 38S in the tenth embodiment. The controller 6D includes a sub-leakage determination device 41 in replacement of the leakage determination device 41 of the controller 6C. The counter 43 and the leakage determination device 44 are connected to the output terminal of the sub-leakage determination device 41 in series. The on-time measurement device 39, the on-time registers 40_$n$ and 40_$n$+1, and the leakage determination device 41 are included in the low-potential-side detector.

Figure 26:
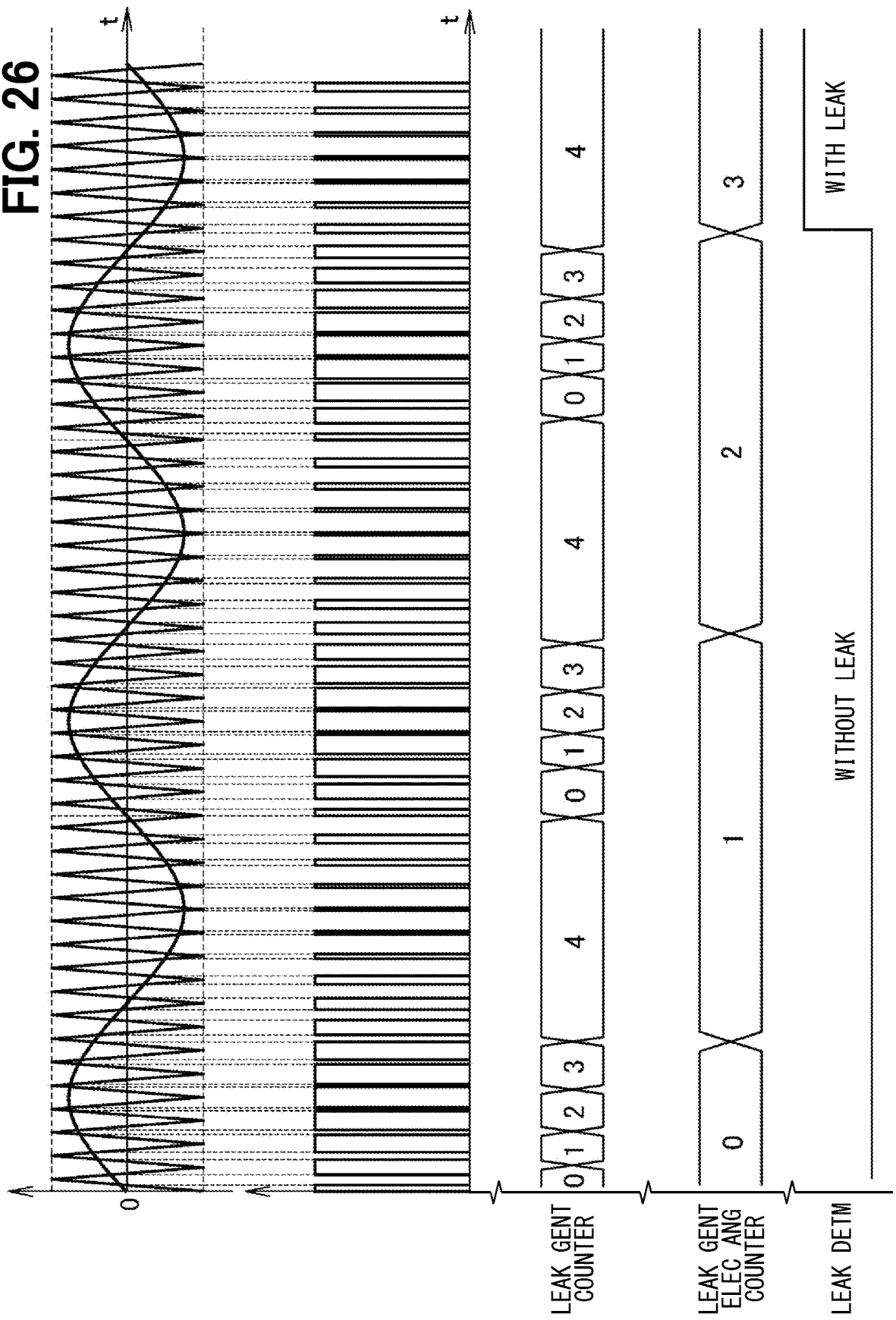
FIG. 26 illustrates a timing chart showing a change in a count value of a counter.

The counter 43 counts the number of times the sub-leakage determination device 41 determines that there is a leakage. The counter 43 is reset based on the condition that the count value of the counter 34 does not reach "4" in the leakage determination period. As illustrated in FIG. 26, when the counter 43 is incremented over three determination cycles and the count value reaches "3", the leakage determination device 44 determines that there is a leakage.

The seventh to eleventh embodiments describe a circuit for detecting the leakage current at the source side. However, the circuit for detecting the leakage current at the drain side may also be applied to each embodiment. When the ninth embodiment is applied to a circuit for detecting the leakage current at the drain side, the device corresponding to the on-period determination device 37 is an off-period determination device for executing the determination at the off-period of the power element 1.

Twelfth Embodiment

Figure 27:
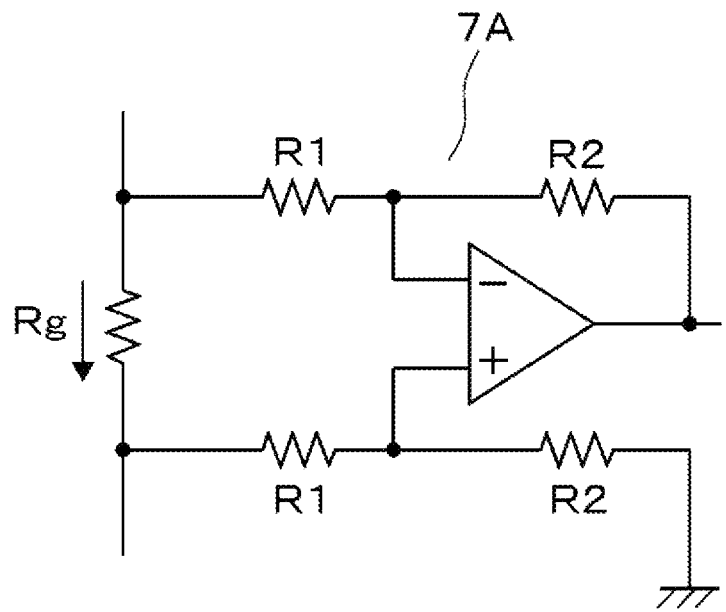
FIG. 27 illustrates an example of a current sense amplifier according to a twelfth embodiment.

A twelfth embodiment illustrates an example of the circuitry configuration of the current sense amplifier 7. As illustrated in FIG. 27, the twelfth embodiment illustrates that a current sense amplifier 7A is configured by a single-stage amplifier circuit.

Thirteenth Embodiment

Figure 28:
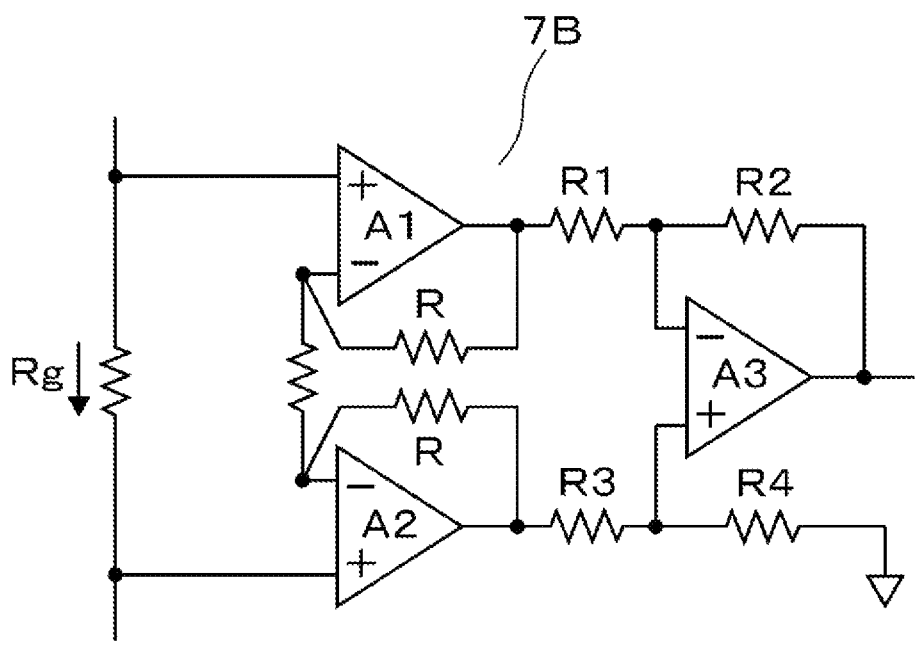
FIG. 28 illustrates an example of a current sense amplifier according to a thirteenth embodiment.

As illustrated in FIG. 28, the thirteenth embodiment illustrates that a current sense amplifier 7B is configured by an instrumentation amplifier.

Fourteenth Embodiment

Figure 29:
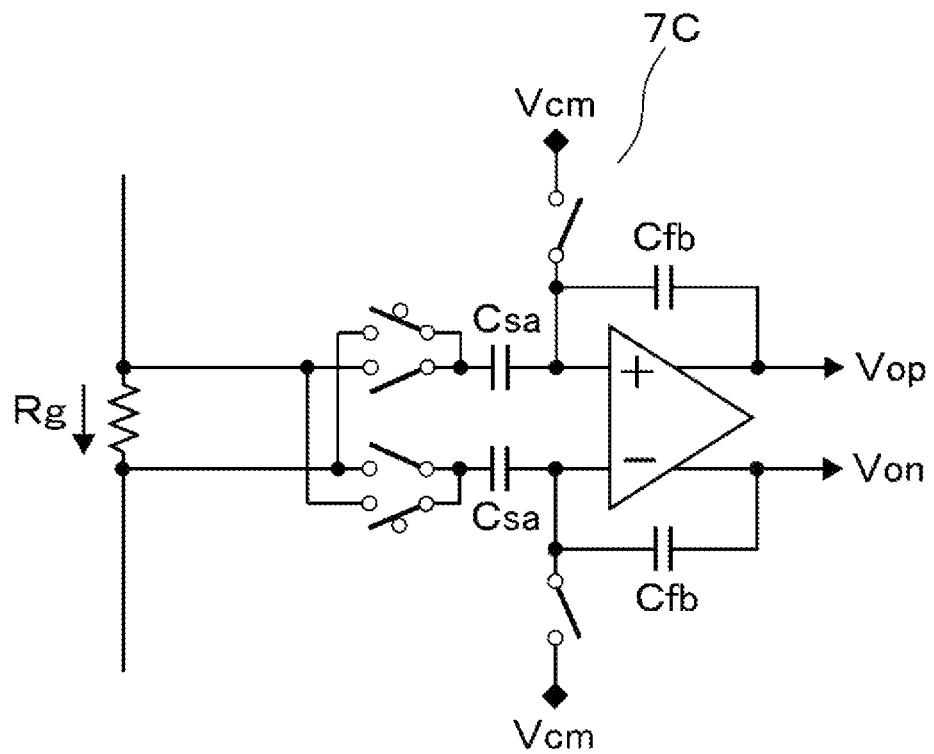
FIG. 29 illustrates an example of a current sense amplifier according to a fourteenth embodiment.

As illustrated in FIG. 29, the fourteenth embodiment illustrates that a current sense amplifier 7C is configured by a switched capacitor circuit.

Fifteenth Embodiment

Figure 30:
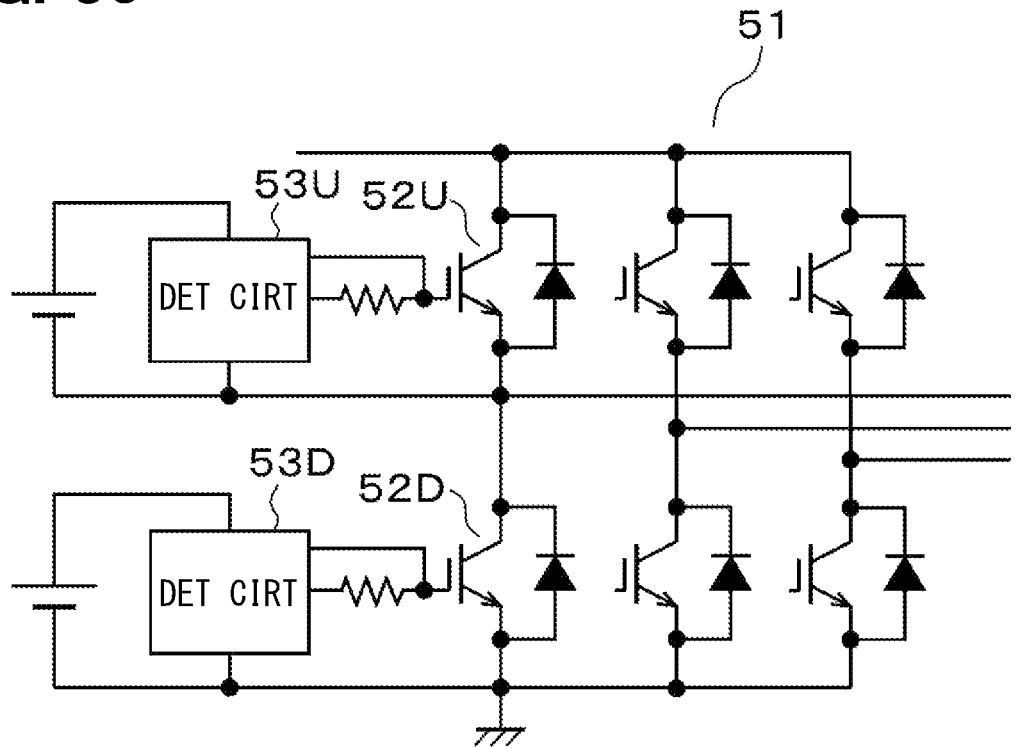
FIG. 30 illustrates a configuration having a leakage current detection circuit for each of respective power elements in upper and lower arms of an inverter circuit.

The first to eleventh embodiments describe that the leakage current detection circuit is a circuit 53D for detecting the leakage current in the power element 52D at the lower arm of the inverter circuit 51 illustrated in FIG. 30. However, as illustrated in the same drawing, the leakage current detection circuit may also be the leakage current detection circuit 53U for the power element 52U in the upper arm of the inverter circuit 51. If the power element 52U is an IGBT, the high-potential-side conduction terminal is a collector and the low-potential-side conduction terminal is an emitter. If the power element 52U is a P-channel MOSFET, the high-potential-side conduction terminal is a source and the low-potential-side conduction terminal is a drain.

Sixteenth Embodiment

Figure 31:
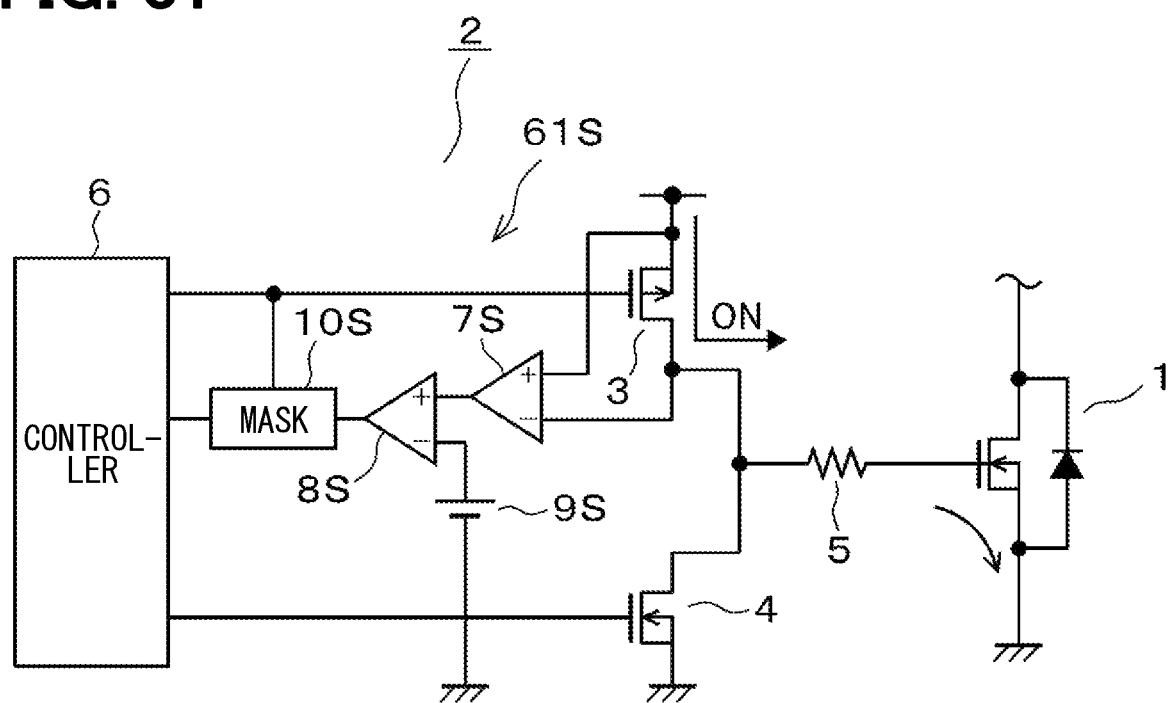
FIG. 31 illustrates a configuration of a leakage current detection circuit according to a sixteenth embodiment.

As illustrated in FIG. 31, a leakage current detection circuit 61S according to a sixteenth embodiment includes the current sense amplifier 7S whose non-inverting input terminal and inverting input terminal are respectively connected to the drain and the source of the on-side drive element 3. In other words, the on-resistance of the on-side drive element 3 in replacement of the gate resistor 5 is adopted to detect the leakage current. It is possible to adopt the on-resistance of the off-side drive element 4 for the leakage current detection circuit 61D.

Seventeenth Embodiment

Figure 32:
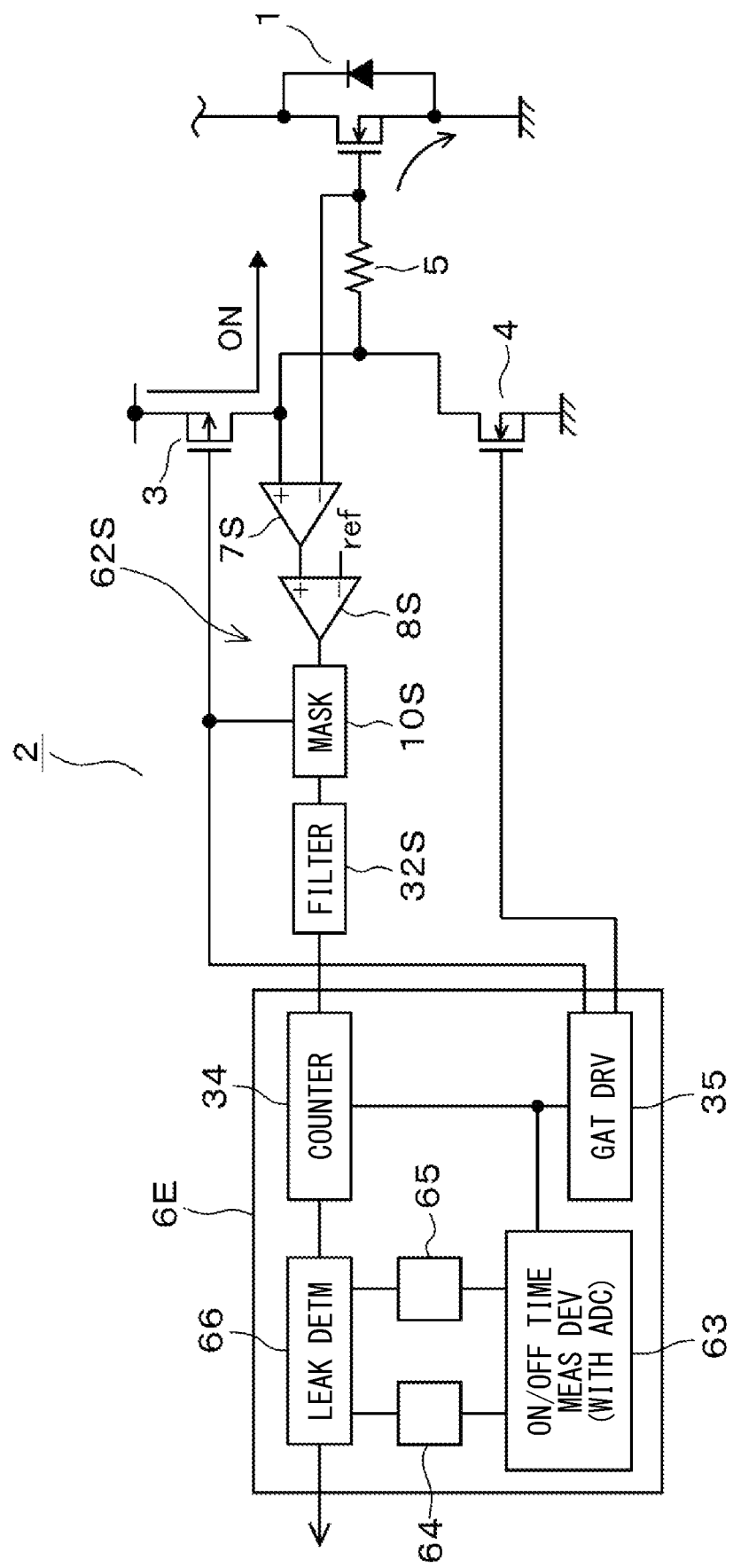
FIG. 32 illustrates a configuration of a leakage current detection circuit according to a seventeenth embodiment.
Figure 33:
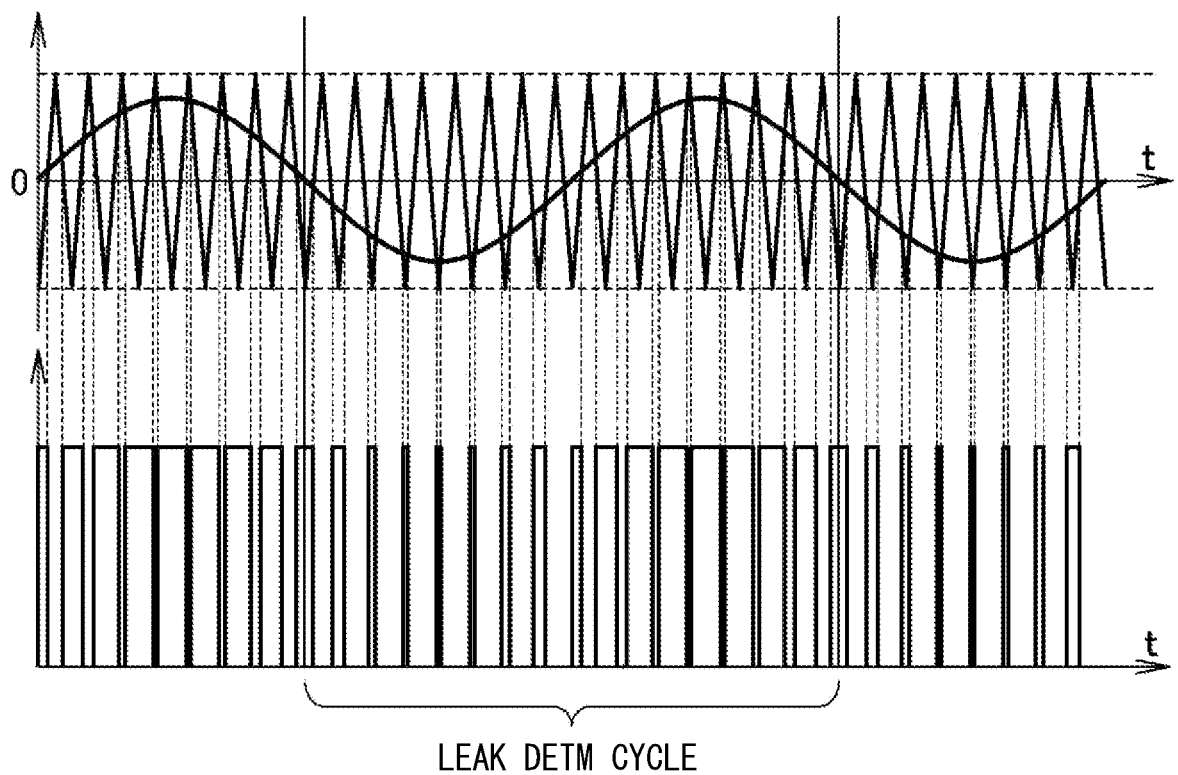
FIG. 33 illustrates a cycle for determining the leakage current.

A seventeenth embodiment describes a leakage current detection circuit 62S as illustrated in FIGS. 32, 33. The leakage current detection circuit 62S includes a controller 6E in replacement of the controller 6C in the leakage current detection circuit 38S in the tenth embodiment. As similar to the tenth embodiment, when the pattern of the on/off control of the power element 1 is repeated for each electric angle cycle according to a predetermined waveform, the electric angle cycle as the leakage determination cycle is detected by detecting the zero crossing point of the waveform.

The controller 6E includes an on/off time measurement device 63, an on-time register 64, an off-time register 65 and a leakage determination device 66 in replacement of the on-time measurement device 39, the on-time registers 40_$n$, 40_$n$+1 and the leakage determination device 41. The on/off time measurement device 63, the on-time register 64, the off-time register 65 and the leakage determination device 66 are included in the low-potential-side detector. The high-potential-side detector may also be similarly configured as described above. The same may be applied to other embodiments.

The following describes an operation in a seventeenth embodiment. At the zero-crossing point, the duty ratio of the PWM signal becomes 50% so that the on-time and off-time relationships of the power element 1 are switched before and after the zero-crossing point. The on/off time measurement device 63 measures the respective times of the pulse width of the on-pulse signal and the pulse width of the off-pulse signal, which are input by the gate driver 35. The measurement results are respectively stored in the on-time register 64 and the off-time register 65. The leakage determination device 66 compares the magnitude of the register value stored in the on-time register 64 with the magnitude of the register value stored in the off-time register 65.

The leakage determination device 66 detects the timing at which a situation of the on-time register value being smaller than the off-time register value is switched to a situation of the on-time register value being larger than the off-time register, or detects the timing at which the situation of the on-time register value being larger than the off-time register value is switched to the situation where the on-time register value being smaller than the off-time register value. Since the interval between each timing corresponds to a single electric angle cycle or one electric angle cycle, the interval is adopted as the determination cycle.

The leakage determination device 66 determines that there is a leakage between the gate and the source, based on a condition that the count value of the counter 34 is larger than or equal to "4" in the above determination cycle, as similar to the tenth embodiment.

A margin may be provided in the determination of the duty ratio of 50% when determining the zero-crossing point. For example, the value acquired by adding the margin value to the on-time register value or subtracting the margin value from the on-time register value may be compared with the off-time register value, or the value acquired by adding the margin value to the off-time register value or subtracting the margin value from the off-time register value may be compared with the on-time register value. Furthermore, in order to prevent a short circuit between the upper and lower arms, a dead time, which is a period during which the upper and lower arms are turned off at the same time, is applied even when the duty ratio is around 50%.

Eighteenth Embodiment

Figure 34:
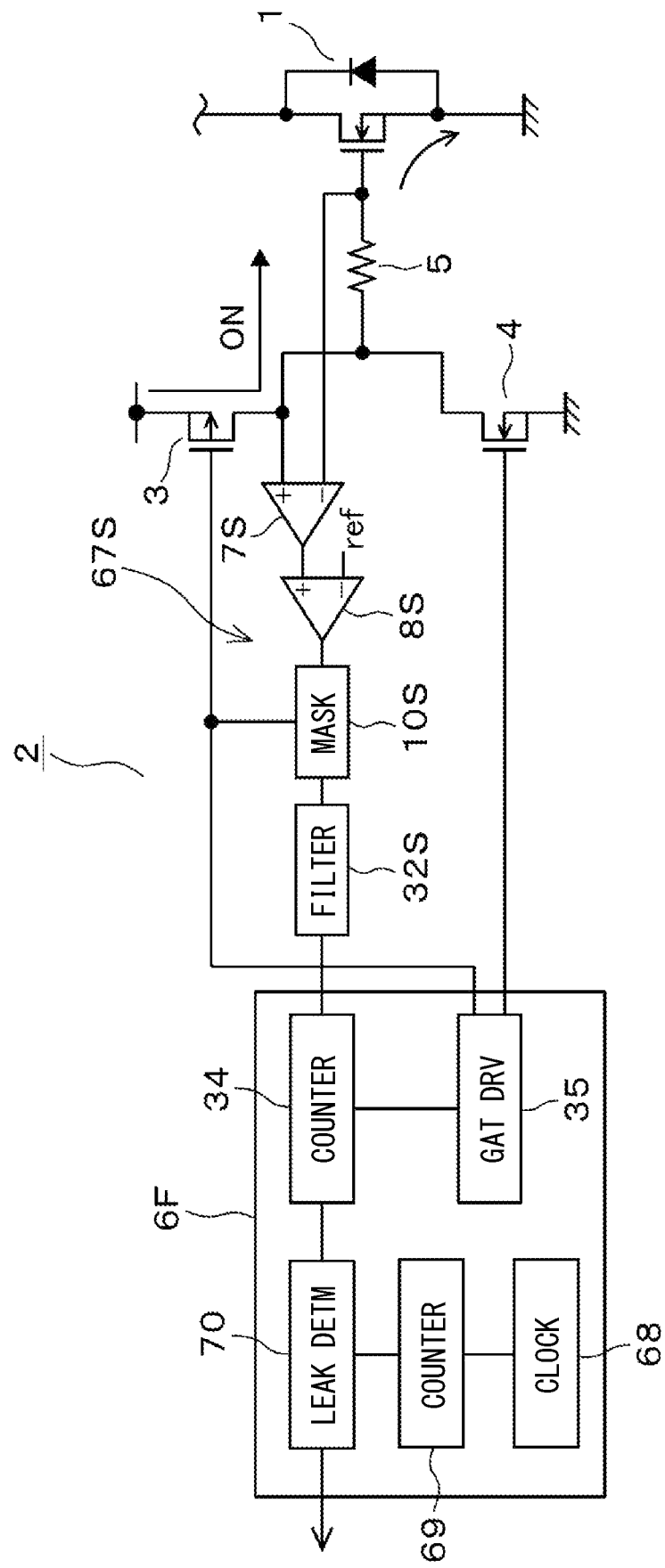
FIG. 34 illustrates a configuration of a leakage current detection circuit according to an eighteenth embodiment.

An eighteenth embodiment describes a leakage current detection circuit 67S as illustrated in FIG. 34. The leakage current detection circuit 62S includes a controller 6F in replacement of the controller 6E in the leakage current detection circuit 62S in the seventeenth embodiment. The controller 6F includes a clock generation circuit 68, a counter 69 and a leakage determination device 70 in replacement of the on/off time measurement device 63, the on-time register 64, the off-time register 65 and the leakage determination device 66 in the controller 6E.

The counter 69 counts the number of clock pulses output by the clock generation circuit 68 and executes the notification of the count value reaching a predetermined value to the leakage determination circuit 70. In addition, the counter 69 resets the count value. The predetermined value may be set to 200 or larger, for instance, if the rotation speed is 3000 rpm and the carrier frequency of the PWM control is 10 kHz. The leakage determination circuit 70 adopts the interval of the notification from the counter 69 as the determination cycle. The determination cycle is, for example, a time sufficiently longer than the above-mentioned single electric angle cycle.

Nineteenth Embodiment

Figure 35:
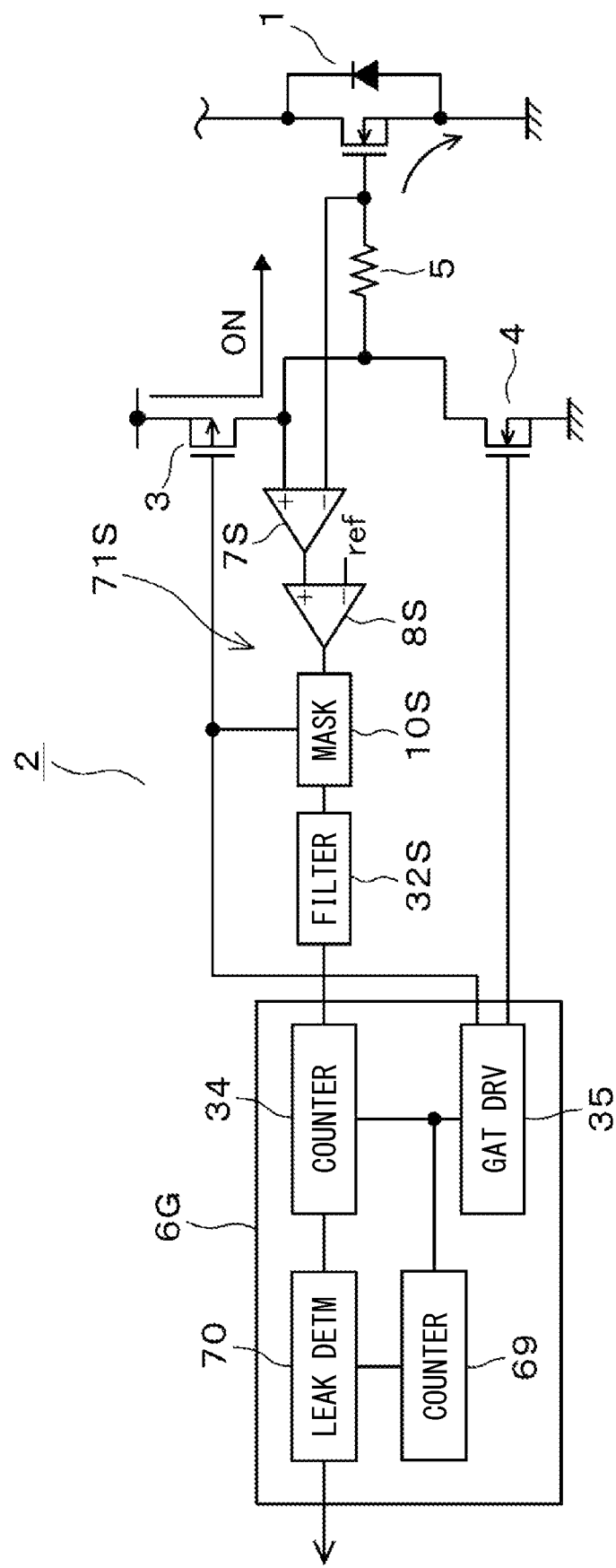
FIG. 35 illustrates a configuration of a leakage current detection circuit according to a nineteenth embodiment.

A nineteenth embodiment describes a leakage current detection circuit 71S as illustrated in FIG. 35. The leakage current detection circuit 71S includes a controller 6G in replacement of the controller 6F in the leakage current detection circuit 67S in the eighteenth embodiment. The controller 6G does not have the clock generation circuit 68. The counter 69 in the controller 6G counts the number of the pulses of on-signal or off-signal output by the gate driver 35, and executes the notification to the leakage determination device 70 as similar to the eighteenth embodiment. In other words, the predetermined value for a value acquired by counting the number of output pulses is the determination cycle.

Twentieth Embodiment

Figure 36:
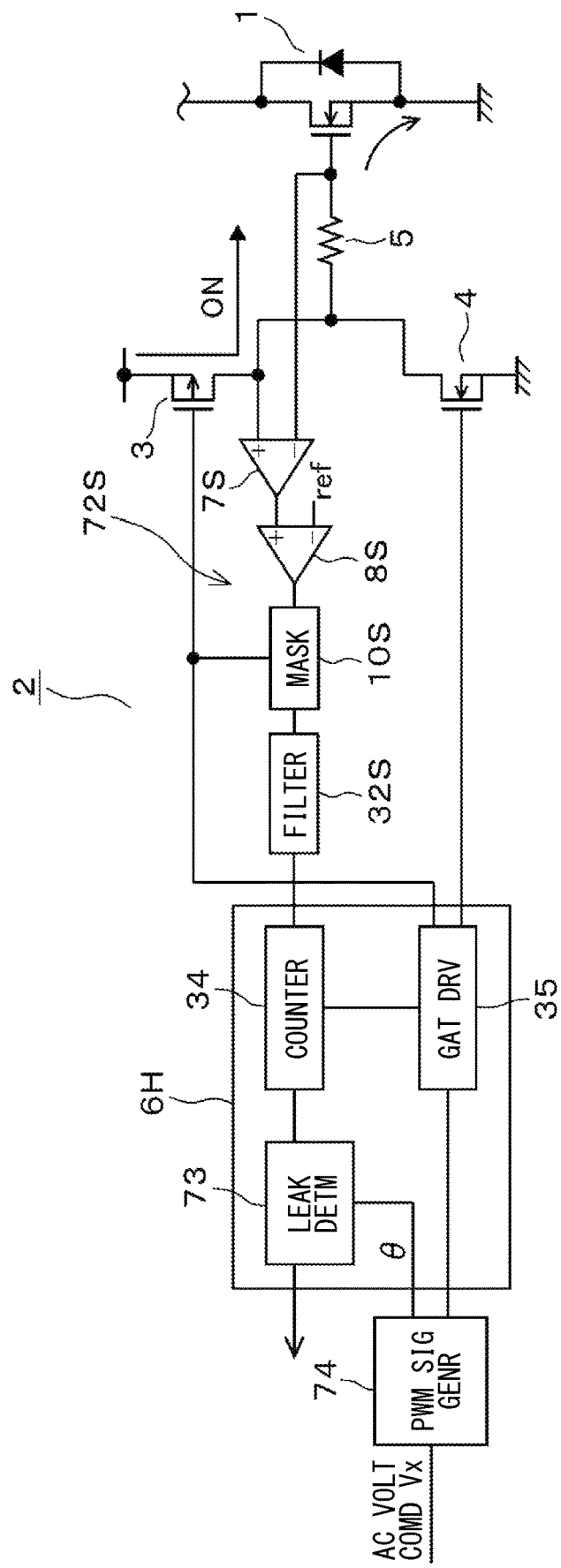
FIG. 36 illustrates a configuration of a leakage current detection circuit according to a twentieth embodiment.

A twentieth embodiment describes a leakage current detection circuit 72S as illustrated in FIG. 36. The leakage current detection circuit 72S includes a controller 6H in replacement of the controller 6G in the leakage current detection circuit 71S in the nineteenth embodiment. The controller 6G includes the counter 34, the gate driver 35 and the leakage determination device 73. A PWM signal generation circuit 74 generates a PWM signal based on an alternating current (AC) voltage command Vx and the electric angle information θ generated by the internal carrier counter, and outputs the PWM signal to the gate driver 35. The leakage determination device 73 receives the input of the electric angle information θ, and detects the single electric angle cycle to set the determination cycle based on the electric angle information θ as similar to the seventeenth embodiment.

Twenty-First Embodiment

Figure 37:
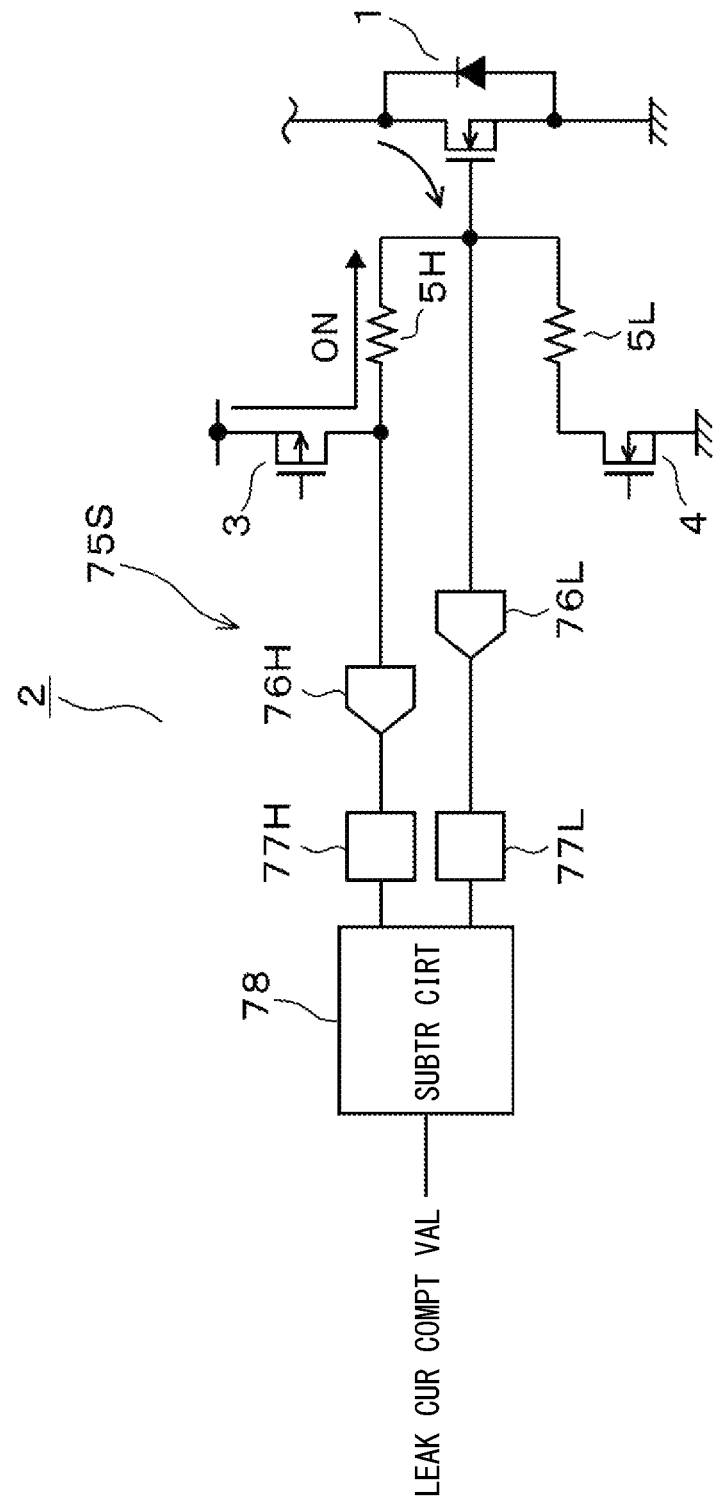
FIG. 37 illustrates a configuration of a leakage current detection circuit according to a twenty-first embodiment.

A twenty-first embodiment describes a leakage current detection circuit 75S as illustrated in FIG. 37. In contrast to the configuration described in the fourth embodiment having the gate resistors 5H, 5L, the leakage current detection circuit 75S further includes analog-to-digital (A/D) converters 76H, 76L that detects the voltage across the terminals of the gate resistors 5H through A/D conversion. The input terminal of the A/D converter 76H is connected to the drain of the on-side drive element 3, and the input terminal of the A/D converter 76L is connected to the common connection node between the gate resistors 5H and 5L. The respective reference potentials of the A/D converters 76H and 76L are both ground.

The data converted through the A/D conversion is stored in the respective registers 77H, 77L, and these register values are sent to a subtraction circuit 78. If the subtraction circuit 78 subtracts the register value in the register 77L from the register value of the register 77H, it is possible to detect the voltage across the terminals of the gate resistor 5H and detect the current flowing through the gate resistor 5H through the terminal voltage.

Other Embodiments

The power element is not merely limited to MOSFET or IGBT.

The count value of the counter for determining the leakage current may be appropriately changed.

The controller, the control module and the control block described in the present description is implemented not only by dedicated hardware having a configuration and a function described in relation to each embodiment. The controller can also be implemented as a combination of a program recorded on such a recording medium as memory and a hard disk and general-purpose hardware including dedicated or general-purpose CPU, memory, or the like, capable of executing the program.

Although the present disclosure has been described in accordance with the examples, it is understood that the present disclosure is not limited to such examples or structures. The present disclosure encompasses various modifications and variations within the scope of equivalents. Furthermore, various combination and formation, and other combination and formation including one, more than one or less than one element may be made in the present disclosure.

What is claimed is:

1. A leakage current detection circuit for detecting a leakage current in a semiconductor element, the leakage current detection circuit comprising:
   a setting circuit; and
   a detector,
   wherein the semiconductor element includes
      a first terminal at a high-potential-side of the semiconductor element,
      a second terminal at a low-potential-side of the semiconductor element, and
      a control terminal configured to receive a signal for controlling a conduction state between the first terminal and the second terminal, and further configured to be insulated from the first terminal and the second terminal,
   wherein the setting circuit is configured to set a duration during which a charging current flows to the control terminal for an undetectable duration, in response to turning on the semiconductor element, and wherein the detector is configured to output a detected signal based on a condition that the leakage current flows from the control terminal to the second terminal after the undetectable duration has elapsed.

2. The leakage current detection circuit according to claim 1,
wherein the setting circuit is a first setting circuit, and the detector is a first detector,
wherein the undetectable duration is a first undetectable duration, and
wherein the leakage current detection further comprises:
a second setting circuit configured to set a duration during which a discharging current flows out from the control terminal for a second undetectable duration in response to turning off the semiconductor element; and
a second detector configured to output a detected signal based on a condition that the leakage current flows from the first terminal to the control terminal after the second undetectable duration has elapsed.

3. The leakage current detection circuit according to claim 2,
wherein each of the first detector and the second detector is connected to a resistor, which is connected to the control terminal in series.

4. The leakage current detection circuit according to claim 2,
wherein the first detector is connected to a first resistor disposed at a charging path through which the charging current flows to the control terminal, and
wherein the second detector is connected to a second resistor disposed at a discharging path through which the discharging current flows out from the control terminal.

5. The leakage current detection circuit according to claim 4,
wherein the first resistor is a shunt resistor having an end connected to a power supply and having another end provided with a drive circuit configured to turn on the semiconductor element through a constant current drive system, and
wherein the second resistor is a shunt resistor having an end connected to a ground and having another end provided with the drive circuit further configured to turn off the semiconductor element through the constant current drive system.

6. The leakage current detection circuit according to claim 1, further comprising:
a filter circuit configured to filter the detected signal in a low frequency region.

7. The leakage current detection circuit according to claim 6,
wherein the detector includes a counter configured to count number of detections of the leakage current as a count value,
wherein the detector is further configured to output the detected signal, based on the count value is incremented in succession by turning on the semiconductor element and reaches to a predetermined value, and
wherein the detector further includes a determination device configured to exclude an increment in the count value for an output duration of a signal for turning on the semiconductor element that is shorter than a sum of the undetectable duration and a time constant of the filter circuit.

8. The leakage current detection circuit according to claim 1,
wherein the detector includes a counter configured to count number of detections of the leakage current as a count value, and
wherein the detector is further configured to output the detected signal, based on a condition that the count value is incremented in succession by turning on the semiconductor element and reaches a predetermined value.

9. The leakage current detection circuit according to claim 8,
wherein the detector is further configured to output the detected value, based on a condition that the count value reaches the predetermined value within a predetermined duration.

10. The leakage current detection circuit according to claim 8,
wherein the detector is further configured to output the detected signal, based on a condition that the count value reaches the predetermined value within a duration during which a signal for turning on and off the semiconductor element has been output only predetermined number of times.

11. The leakage current detection circuit according to claim 8,
wherein the detector further includes a leakage determination device, and
wherein, in a case where the semiconductor element is controlled to be turned on and off according to a predetermined waveform in each cycle of an electric angle, the leakage determination device is configured to output the detected signal based on a condition that the count value reaches the predetermined value in one cycle of the electric angle.

12. The leakage current detection circuit according to claim 11,
wherein the detector is further configured to determine the one cycle of the electric angle based on a zero-crossing point where a polarity of a signal for turning on and off the semiconductor element changes.

13. The leakage current detection circuit according to claim 11, further comprising:
a signal output device configured to output a signal for turning on and off the semiconductor element,
wherein the detector is further configured to determine the one cycle of the electric angle, based on information of the electric angle received from the signal output device.

14. The leakage current detection circuit according to claim 8,
wherein the detector further includes a leakage determination device, and
wherein, in a case where the semiconductor element is controlled to be turned on and off according to a predetermined waveform in each cycle of an electric angle, the leakage determination device is configured to output the detected signal, based on a condition that a situation of the count value reaching the predetermined value in one cycle of the electric angle has occurred continuously over a plurality of cycles of the electric angle.

15. The leakage current detection circuit according to claim 1, further comprising:
a drive element configured to be turned on for enabling the charging current to flow into the control terminal, based on a condition that the semiconductor element is turned on, wherein the detector is further configured to detect the leakage current through on-resistance of the drive element.

16. A leakage current detection circuit for detecting a leakage current in a semiconductor element, the leakage current detection circuit comprising:
a setting circuit; and
a detector,
wherein the semiconductor element includes
a first terminal at a high-potential-side of the semiconductor element,
a second terminal at a low-potential-side of the semiconductor element, and
a control terminal configured to receive a signal for controlling a conduction state between the first terminal and the second terminal, and further configured to be insulated from the first terminal and the second terminal,
wherein the setting circuit is configured to set a duration during which a discharging current flows out from the control terminal for an undetectable duration, in response to turning off the semiconductor element, and
wherein the detector is configured to output a detected signal based on a condition that the leakage current flows from the first terminal to the control terminal after the undetectable duration has elapsed.

17. The leakage current detection circuit according to claim 16,
wherein the detector includes a counter configured to count number of detections of the leakage current as a count value, and
wherein the detector is further configured to output the detected signal, based on a condition that the count value is incremented in succession by turning off the semiconductor element and reaches a predetermined value.

18. The leakage current detection circuit according to claim 16, further comprising:
a filter circuit configured to filter the detected signal in a low frequency region,
wherein the detector includes a counter configured to count number of detections of the leakage current as a count value,
wherein the detector is further configured to output the detected signal, based on a condition that the count value is incremented in succession by turning off the semiconductor element and reaches to a predetermined value, and
wherein the detector further includes a determination device configured to exclude an increment in the count value for an output duration of a signal for turning off the semiconductor element that is shorter than a sum of the undetectable duration and a time constant of the filter circuit.

19. The leakage current detection circuit according to claim 16, further comprising:
a drive element configured to be turned on for enabling the discharging current to flow out from the control terminal, based on a condition that the semiconductor element is turned off,
wherein the detector is further configured to detect the leakage current through on-resistance of the drive element.

20. The leakage current detection circuit according to claim 16,
wherein the setting circuit includes an AND gate and a timer.

21. The leakage current detection circuit according to claim 20,
wherein one of input terminals of the AND gate is connected to the detector, and another one of input terminals of the AND gate is connected to the timer.

22. The leakage current detection circuit according to claim 16, further comprising:
a resistor connected to the setting circuit and the semiconductor element.

23. The leakage current detection circuit according to claim 16,
wherein the discharging current flows to the detector from the control terminal.

* * * * *

UNITED STATES PATENT AND TRADEMARK OFFICE
CERTIFICATE OF CORRECTION

| | |
|---|---|
| PATENT NO. | : 12,174,266 B2 |
| APPLICATION NO. | : 17/732819 |
| DATED | : December 24, 2024 |
| INVENTOR(S) | : Junichi Hasegawa and Akimasa Niwa |

It is certified that error appears in the above-identified patent and that said Letters Patent is hereby corrected as shown below:

On the Title Page

Item (54) and in the Specification, Column 1, Lines 1-2:
Change the title from LEAKAGE CURRENT DETECTION CIRCUIT FOR SEMICONDUCTOR to LEAKAGE CURRENT DETECTION CIRCUIT FOR SEMICONDUCTOR ELEMENT.

Signed and Sealed this
Fourth Day of March, 2025

Coke Morgan Stewart
*Acting Director of the United States Patent and Trademark Office*